United States Patent
Sandhu et al.

(10) Patent No.: US 7,341,957 B2
(45) Date of Patent: *Mar. 11, 2008

(54) MASKING STRUCTURE HAVING MULTIPLE LAYERS INCLUDING AMORPHOUS CARBON LAYER

(75) Inventors: Gurtej S. Sandhu, Boise, ID (US); Zhiping Yin, Boise, ID (US); Weimin Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/215,671

(22) Filed: Aug. 30, 2005

(65) Prior Publication Data

US 2006/0001175 A1    Jan. 5, 2006

Related U.S. Application Data

(62) Division of application No. 10/661,100, filed on Sep. 12, 2003, now Pat. No. 7,129,180.

(51) Int. Cl.
*H01L 21/302* (2006.01)
*H01L 21/461* (2006.01)

(52) U.S. Cl. .................. 438/717; 257/E21.27; 257/760

(58) Field of Classification Search ............... 438/717; 257/760

See application file for complete search history.

(56) References Cited

U.S. PATENT DOCUMENTS

| | | | |
|---|---|---|---|
| 570,316 A | 10/1896 | Le Blois et al. | |
| H566 H | 1/1989 | Nyaiesh et al. | |
| 4,849,642 A | 7/1989 | Katsumi | |
| 4,971,853 A | 11/1990 | Chaiken et al. | |
| 4,975,144 A | 12/1990 | Yamazaki et al. | |
| 5,096,791 A | 3/1992 | Yahalom | |
| 5,198,263 A | 3/1993 | Stafford et al. | |
| 5,324,365 A | 6/1994 | Niwa | |
| 5,346,729 A | 9/1994 | Pitts et al. | |
| 5,358,880 A | 10/1994 | Lebby et al. | |
| 5,369,040 A | 11/1994 | Halvis et al. | |

(Continued)

FOREIGN PATENT DOCUMENTS

EP   0531232 A2   3/1993

(Continued)

OTHER PUBLICATIONS

"International Search Report and the Written Opinion of the International Searching Authority, or the Declaration of Application No. PCT/US2004/029209, date mailed Dec. 22, 2004", 15 pages.

(Continued)

*Primary Examiner*—David A. Zarneke
(74) *Attorney, Agent, or Firm*—Schwegman, Lundberg & Woessner, P.A.

(57) ABSTRACT

A masking structure having multiple layers is formed. The masking structure includes an amorphous carbon layer and a cap layer formed over the amorphous carbon layer. The amorphous carbon layer includes transparent amorphous carbon. The cap layer includes non-oxide materials. The masking structure may be used as a mask in an etching process during fabrication of semiconductor devices.

58 Claims, 17 Drawing Sheets

U.S. PATENT DOCUMENTS

| | | | |
|---|---|---|---|
| 5,420,043 A | 5/1995 | Kaisha |
| 5,431,800 A | 7/1995 | Kirchhoff |
| 5,437,961 A | 8/1995 | Yano et al. |
| 5,470,661 A | 11/1995 | Bailey et al. |
| 5,496,752 A | 3/1996 | Nasu et al. |
| 5,514,885 A | 5/1996 | Myrick |
| 5,578,501 A | 11/1996 | Niwa |
| 5,589,307 A | 12/1996 | Tacheuchi |
| 5,629,532 A | 5/1997 | Myrick |
| 5,669,644 A | 9/1997 | Kaihotsu et al. |
| 5,723,029 A | 3/1998 | Shimoyama |
| 5,733,713 A | 3/1998 | Yano et al. |
| 5,750,316 A | 5/1998 | Kawamura et al. |
| 5,800,878 A | 9/1998 | Yao |
| 5,830,332 A | 11/1998 | Babich et al. |
| 5,998,100 A | 12/1999 | Azuma |
| 6,035,803 A | 3/2000 | Robles et al. |
| 6,107,734 A | 8/2000 | Taneka et al. |
| 6,128,700 A | 10/2000 | Hsu et al. |
| 6,128,868 A | 10/2000 | Ohtsuka et al. |
| 6,136,160 A | 10/2000 | Hrkut et al. |
| 6,140,570 A | 10/2000 | Kariya |
| 6,140,652 A | 10/2000 | Schlepr et al. |
| 6,211,065 B1 | 4/2001 | Xi et al. |
| 6,221,535 B1 | 4/2001 | Cox et al. |
| 6,291,334 B1 | 9/2001 | Somekh |
| 6,300,631 B1 | 10/2001 | Shofner |
| 6,313,896 B1 | 11/2001 | Samant et al. |
| 6,316,329 B1 | 11/2001 | Hirota et al. |
| 6,323,119 B1 | 11/2001 | Xi et al. |
| 6,331,380 B1 | 12/2001 | Ye et al. |
| 6,346,184 B1 | 2/2002 | Sano et al. |
| 6,350,997 B1 | 2/2002 | Saeki |
| 6,394,109 B1 | 5/2002 | Somekh |
| 6,420,095 B1 | 7/2002 | Kawamura et al. |
| 6,423,384 B1 | 7/2002 | Khazeni et al. |
| 6,427,703 B1 | 8/2002 | Somekh |
| 6,444,899 B2 | 9/2002 | Kubota et al. |
| 6,447,891 B1 | 9/2002 | Veerasamy et al. |
| 6,461,950 B2 | 10/2002 | Yin et al. |
| 6,483,127 B2 | 11/2002 | Saeki |
| 6,508,911 B1 | 1/2003 | Han et al. |
| 6,541,397 B1 | 4/2003 | Bencher |
| 6,551,941 B2 | 4/2003 | Yang et al. |
| 6,566,757 B1 | 5/2003 | Banerjee |
| 6,573,030 B1 | 6/2003 | Fairbairn et al. |
| 6,583,481 B2 | 6/2003 | Itoh |
| 6,613,603 B1 | 9/2003 | Sano |
| 6,621,535 B1 | 9/2003 | Fukada |
| 6,624,064 B1 | 9/2003 | Sahin et al. |
| 6,627,532 B1 | 9/2003 | Gaillard |
| 6,649,469 B1 | 11/2003 | Wilson |
| 6,653,735 B1 | 11/2003 | Yang et al. |
| 6,668,752 B2 | 12/2003 | Yao |
| 6,780,753 B2 | 8/2004 | Latchford et al. |
| 6,784,119 B2 | 8/2004 | Gaillard et al. |
| 6,795,636 B1 | 9/2004 | Cronk et al. |
| 6,803,313 B2 | 10/2004 | Gao et al. |
| 6,821,571 B2 | 11/2004 | Huang |
| 6,825,114 B1 | 11/2004 | Fisher et al. |
| 6,841,341 B2 | 1/2005 | Fairbairn et al. |
| 6,852,647 B2 | 2/2005 | Bencher |
| 6,864,556 B1 | 3/2005 | You et al. |
| 6,875,664 B1 | 4/2005 | Huang et al. |
| 6,875,687 B1 | 4/2005 | Weidman |
| 6,884,733 B1 | 4/2005 | Dakshina-Murthy et al. |
| 7,129,180 B2 | 10/2006 | Sandhu et al. |
| 7,132,201 B2 | 11/2006 | Yin et al. |
| 2001/0006837 A1 | 7/2001 | Kwon et al. |
| 2001/0011730 A1 | 8/2001 | Saeki |
| 2001/0017153 A1 | 8/2001 | Kubota et al. |
| 2001/0035551 A1 | 11/2001 | Kotecki et al. |
| 2002/0001778 A1 | 1/2002 | Latchford et al. |
| 2002/0003239 A1 | 1/2002 | Ramdani et al. |
| 2002/0086547 A1 | 7/2002 | Mui et al. |
| 2002/0100696 A1 | 8/2002 | Sano et al. |
| 2003/0198814 A1 | 10/2003 | Khieu et al. |
| 2003/0207207 A1 | 11/2003 | Li |
| 2004/0092098 A1 | 5/2004 | Sudijono et al. |
| 2005/0056835 A1 | 3/2005 | Yin et al. |
| 2005/0056940 A1 | 3/2005 | Sandhu et al. |
| 2006/0003237 A1 | 1/2006 | Yin et al. |
| 2006/0008741 A1 | 1/2006 | Yin et al. |
| 2006/0022247 A1 | 2/2006 | Yin et al. |
| 2006/0244086 A1 | 11/2006 | Yin et al. |

FOREIGN PATENT DOCUMENTS

| | | |
|---|---|---|
| EP | 1154468 A2 | 11/2001 |
| JP | 58-204534 A | 11/1983 |
| WO | WO-03038875 A2 | 5/2003 |
| WO | WO-2004/012246 A2 | 2/2004 |
| WO | WO-2004012246 A2 | 2/2004 |
| WO | WO-2005034216 A1 | 4/2005 |
| WO | WO-2005034229 A1 | 4/2005 |

OTHER PUBLICATIONS

Liu, W., et al., "Generating Sub-30nm Poly-Silicon Gates Using PECVD Amorphous Carbon as Hardmask and Anti-Reflective Coating", *Proceedings of the SPIE*, 5040, Optical Microlithography XVI, Yen, A, (ed.),(Feb. 25, 2003),841-848.

Pelton, Matthew, et al., "The optical absorption edge of diamond-like carbon: A quantum well model", *Journal of Applied Physics*, 83(2), (Jan. 15, 1998),1029-35.

Shieh, J. -., et al., "Characteristics of Fluorinated Amorphous Carbon Films and Implementation of 0.15 micron Cu/a-C:F Damascene Interconnection", *Journal of Vacuum Science and Technology*, 19, (May 2001),780-787.

Chen, Z. Y., et al., "Optical Constants of Tetrahedral Amorphous Carbon Films in the Infrared Region and at a Wavelength of 633 nm", *Journal of Applied Physics*, vol. 87 (9), American Institute of Physics,(May 1, 2000),4268-4273.

He, X., et al., "Characterization and Optical Properties of Diamond-like Carbon Prepared by Electron Cyclotron Resonance Plasma", *Journal of Materials Research*, 14(3), (Mar. 1999),1055-1061.

Lide, D. R., et al., "Physical Constants of Organic Compounds", *CRC Handbook of Chemistry and Physics, Internet Version 2005*, http://www.hbcpnetbase.com, (2005), 12-157.

Zhou, X. T., et al., "Deposition and properties of a-C:H films on polymethyl methacrylate by electron cyclotron resonance microwave plasma chemical vapor deposition method", *Surface and Coatings Technology*, 123(2-3), (Jan. 24, 2000),273-277.

Chen, et al., "Optical constants of tetrahedral amorphous carbon films in the infrared region and at a wavelength of 633 nm", *J. Appl Phys.*, 87(9), (May 2000),4268-4273.

He, et al., "Characterization and optical properties of diamondlike carbon prepared by electron cyclotron resonance plasma", *J. Mater. Res.*, 14(3), (1999),1055-1061.

Lide, D. R., *CRC Handbook of Chemistry and Physics, Internet Version 2005*, http://www.hbcpnetbase.com, CRC Press, Boca Raton,(2005),12-157.

Zhou, et al., "Deposition and properties of a-C:H films on polymethyl methacrylate by electron cyclotron resonance microwave plasma chemical vapor deposition method", *Surface and Coatings Technology*, 123, (2000),273-277.

"Notice of Allowance mailed Jul. 3, 2007 in U.S. Appl. No. 11/458,642", 4 pgs.

"Final office action mailed Jul. 18, 2006 in U.S. Appl. No. 10/789,736", 16 pgs.

"Non-final office action mailed Jan. 23, 2006 in U.S. Appl. No. 10/789,736", 15 pgs.

"Non-final office action mailed May 20, 2005 in U.S. Appl. No. 10/661,379", 8 pgs.

"Non-final office action mailed Jun. 9, 2005 in U.S. Appl. No. 10/661,100", 11 pgs.

"Non-final office action mailed Nov. 10, 2005 in U.S. Appl. No. 10/661,379", 9 pgs.

"Notice of allowance mailed Jun. 13, 2006 in U.S. Appl. No. 10/661,100", 4 pgs.

"Notice of allowance mailed Jun. 27, 2006 in U.S. Appl. No. 10/661,379", 4 pgs.

"Notice of allowance mailed Nov. 15, 2006 in U.S. Appl. No. 10/789,736", 6 pgs.

"Notice of allowance mailed Dec. 13, 2005 in U.S. Appl. No. 10/661,100", 4 pgs.

"Response filed Jan. 31, 2006 to non-final office action mailed Nov. 10, 2005 in U.S. Appl. No. 10/661,379", 13 pgs.

"Response filed Apr. 24, 2006 to non-final office action mailed Jan. 23, 2006 in U.S. Appl. No. 10/789,736", 20 pgs.

"Response filed Sep. 9, 2005 to non-final office action mailed Jun. 9, 2005 in U.S. Appl. No. 10/661,100", 13 pgs.

"Response filed Sep. 19, 2005 to non-final office action mailed May 20, 2005 in U.S. Appl. No. 10/661,379", 11 pgs.

US 7,341,957 B2

MASKING STRUCTURE HAVING MULTIPLE LAYERS INCLUDING AMORPHOUS CARBON LAYER

RELATED APPLICATIONS

This application is a Divisional of U.S. Ser. No. 10/661,100, filed Sep. 12, 2003, now U.S. Pat. No. 7,129,180 and is related to the following co-pending and commonly assigned application; application Ser. No. 10/661,379, entitled "TRANSPARENT AMORPHOUS CARBON STRUCTURE SEMICONDUCTOR DEVICES" which is hereby incorporated by reference.

FIELD OF INVENTION

The present invention relates generally to semiconductor devices, more particularly to masking structures in the semiconductor devices.

BACKGROUND

Semiconductor devices such as memory devices reside in many computers and electronic products to store data. A typical semiconductor device has many layers of different materials formed on a semiconductor wafer.

During manufacturing, the layers go through many processes. For example, a patterning process puts patterns on the layers. Some patterning processes use a mask to transfer patterns from the mask to the layers underneath the mask. The patterns on the mask itself are often created using a top layer above the mask.

During the patterning process, the material of the top layer may affect the properties of the layers underneath the top layer and the mask. Some conventional top layers are made of oxide material. In some cases, an oxide top layer affects the layers underneath the top layer and the mask. Thus, in some cases, the top layer made of oxide is not suitable.

SUMMARY OF THE INVENTION

The present invention provides devices having a masking structure and techniques for forming the masking structure. The masking structure includes a mask and a cap layer. The mask is formed from amorphous carbon including transparent amorphous carbon. The cap layer is formed from non-oxide materials.

DETAILED DESCRIPTION OF THE EMBODIMENTS

Figure 1:
FIG. 1 through FIG. 11 show cross-sections of a device during various processing stages according to embodiments of the invention.

The following description and the drawings illustrate specific embodiments of the invention sufficiently to enable those skilled in the art to practice the invention. Other embodiments may incorporate structural, logical, electrical, process, and other changes. In the drawings, like numerals describe substantially similar components throughout the several views. Examples merely typify possible variations. Portions and features of some embodiments may be included in or substituted for those of others. The scope of the invention encompasses the full ambit of the claims and all available equivalents.

FIG. 1 through FIG. 10 show a device 100 during various processing stages according to embodiments of the invention.

FIG. 1 shows a cross-section of a device 100 including a substrate 110. Substrate 110 may represent a part of a wafer, or may be a wafer itself. The wafer may be a semiconductor wafer such as a silicon wafer. Substrate 110 may also be a structure or a layer formed on a wafer. Substrate 110 may include at least one of a non-conducting material, a conducting material, and a semiconducting material. Examples of non-conducting materials include oxide (e.g., $SiO_2$, $Al_2O_3$), nitride (e.g., $Si_3N_4$), and glass (borophosphosilicate glass-BPSG). Examples of conducting materials include aluminum, tungsten, other metals, and compound of metals. Examples of semiconducting materials include silicon, and silicon doped with other materials such as boron, phosphorous, and arsenic. In embodiments represented by FIG. 1, substrate 110 includes a semiconductor material.

Substrate 110 has a surface 112 in which alignment marks 114 are formed. Alignment marks 114 serves reference points or coordinates of substrate (wafer) 110. During an alignment process, the alignment marks 114 are used to align or position substrate 110 such that structures and layers on substrate 110 can be accurately aligned with each other or with substrate 110.

Figure 2:
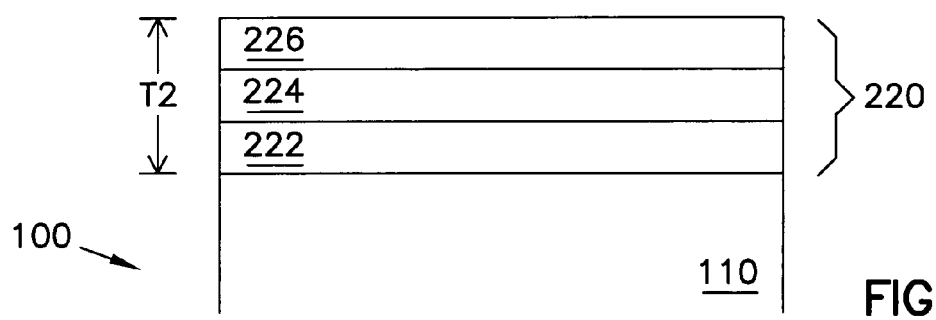

FIG. 2 shows device 100 with a device structure 220 formed over substrate 210. Device structure 220 includes multiple layers 222, 224, and 226. Each of these multiple layers may include at least one of a non-conducting material, semiconducting material, and a conducting material. For example, layer 222 may be an oxide layer; layer 224 may be a metal layer or a layer having a compound of metal and silicon; and layer 226 may be a nitride layer. In some embodiments, multiple layers 222, 224, and 226 are arranged in an order different from the order shown in FIG. 2. Multiple layers 222, 224, and 226 are formed by growing or deposition or by other known processes. In some embodiments, one or more of the layers 222, 224, and 226 is omitted from device structure 220. In other embodiments, one or more additional layers similar to layers 222, 224, and 226 are added to device structure 220. Device structure 220 has a thickness T2. In some embodiments, T2 is greater than 40000 Angstroms.

Figure 3:
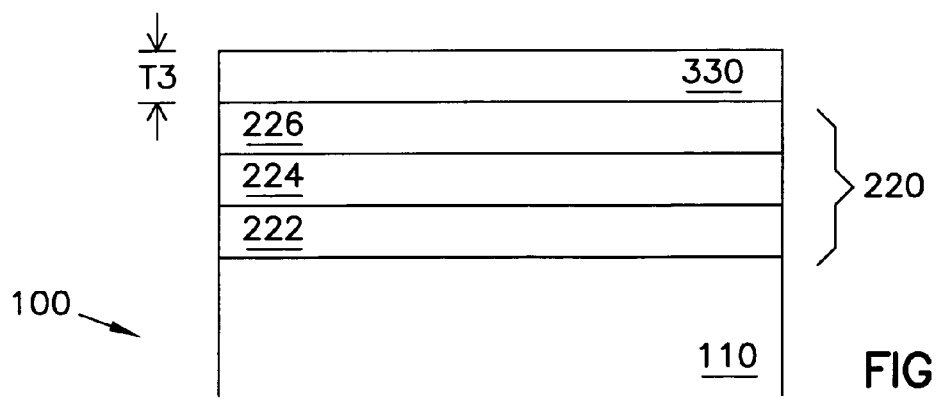

FIG. 3 shows device 100 with a mask (layer) 330 formed over device structure 220. Mask 330 is formed from suitable materials to etch device structure 220 in a subsequent etching process. In embodiments represented by FIG. 2, mask 330 is formed from amorphous carbon. Thus, in FIG. 2, mask 330 is also referred to as amorphous carbon layer 330. Amorphous carbon layer 330 has a thickness T3. In some embodiments, device structure 220 has a certain thickness such that amorphous carbon layer 330 is formed with an adequate to properly etch device structure 220. T3 can be any thickness. In some embodiments, T3 is at least 4000 Angstroms.

In some embodiments, amorphous carbon layer 330 has a low absorption coefficient such that amorphous carbon layer 330 is transparent in visible light range. The visible light range includes electromagnetic radiation having wavelengths between 400 nanometers and 700 nanometers. In some embodiments, amorphous carbon layer 330 has an absorption coefficient (k) between about 0.8 and 0.001 at a wavelength of 633 nanometers. When amorphous carbon layer 330 is transparent in visible light range, amorphous carbon layer 330 is referred to as a transparent amorphous carbon layer. In some embodiments, the transparent amorphous carbon layer has an absorption coefficient (k) between about 0.15 and 0.001 at a wavelength of 633 nanometers.

Amorphous carbon layer 330 may be formed by deposition process. In some embodiments, amorphous carbon layer 330 is formed by chemical vapor deposition (CVD) process. In other embodiments, amorphous carbon layer 330 is formed by plasma enhanced chemical vapor deposition (PECVD) process. Other known processes can also be used to form amorphous carbon layer 330.

In an exemplary PECVD process to form a transparent amorphous carbon layer such as amorphous carbon 330, a process gas including propylene ($C_3H_6$) is introduced into a PEVCD chamber at an exemplary flow rate between about 500 sccm (standard cubic centimeters per minute) and about 2000 sccm. An additional gas including helium may be also introduced into the chamber at an exemplary flow rate between about 250 sccm and about 500 sccm. Further, embodiments exist where at least one of the hydrocarbon gases is used as the process gas. Examples of the other hydrocarbon gases include $CH_4$, $C_2H_2$, $C_2H_4$, $C_2H_6$, and $C_3H_8$. Helium may also be used in combination with at least one of these hydrocarbon gases.

In the above exemplary process to form the transparent amorphous carbon layer such as amorphous carbon 330, a gas mixture is introduced into the chamber. In this specification, the gas mixture may be either one gas only or a combination of at least two gases. For example, the gas mixture may be either propylene ($C_3H_6$) only or a combination of propylene and helium. As another example, the gas mixture may be at least one of the propylene, $CH_4$, $C_2H_2$, $C_2H_4$, $C_2H_6$, and $C_3H_8$. As a further example, the gas mixture may be at least one of the propylene, $CH_4$, $C_2H_2$, $C_2H_4$, $C_2H_6$, and $C_3H_8$ plus helium.

In the exemplary PECVD process of forming the transparent amorphous carbon layer such as amorphous carbon 330, the temperature in the chamber is set between about 200° C. and about 500° C. In some embodiments, the temperature in the chamber is set from about 200° C. to below about 300° C. The chamber is subjected to a radio frequency (RF) power and a pressure. In some embodiments, the radio frequency power is set between about 400 Watts and about 1000 Watts, and the pressure is set between about 4 Torr and about 7 Torr.

Figure 4:
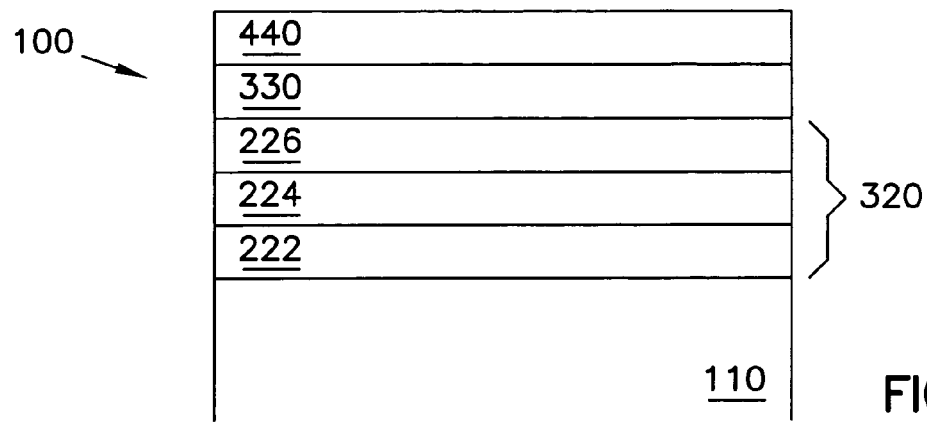

FIG. 4 shows device 100 after a cap layer 440 is formed over amorphous carbon layer 330. Cap layer 440 includes non-oxide materials. Examples of non-oxide materials include boron carbide ($B_xC$), boron nitride (BN), silicon carbide (SiC), silicon nitride ($Si_xN_y$), fluorine doped with oxide (e.g., $SiO_2$:F), fluorine doped with nitride (e.g., $Si_xN_y$:F), fluorine doped with carbide (e.g., SC:F), and fluoride films such as $CaF_x$ and $MgF_x$. An example of oxide material includes silicon oxide ($SiO_2$). In some embodiments, hydrogen is incorporated into the non-oxide materials of cap layer 440. In this specification, fluorinated oxide $SiO_x$:F is considered as a non-oxide material.

In the examples above, x and y represent the number of atoms in a stable compound. For example, in $Si_xN_y$, x represents a number of atoms of silicon that form a stable compound with y atoms of nitrogen. In this example, x may be three and y may be four.

Cap layer 440 can be formed by a deposition process such as a CVD and PECVD process. In some embodiments, cap layer 440 is formed together with amorphous carbon layer 330 in the same process (same processing step) such that cap layer 440 is situ deposited over amorphous carbon layer 330. For example, during or after layer 330 is formed in a CVD or PECVD process similar to the process of described in FIG. 4, a gas including boron such as $B_2H_6$, $B_4H_{10}$, and $BH_3CO$ may be introduced to the chamber to form a cap layer 440 having boron carbide over the amorphous carbon layer 330. In some embodiments, cap layer 440 includes boron carbide with about 0.5 atomic percent to about 70 atomic percent of boron.

Figure 5:
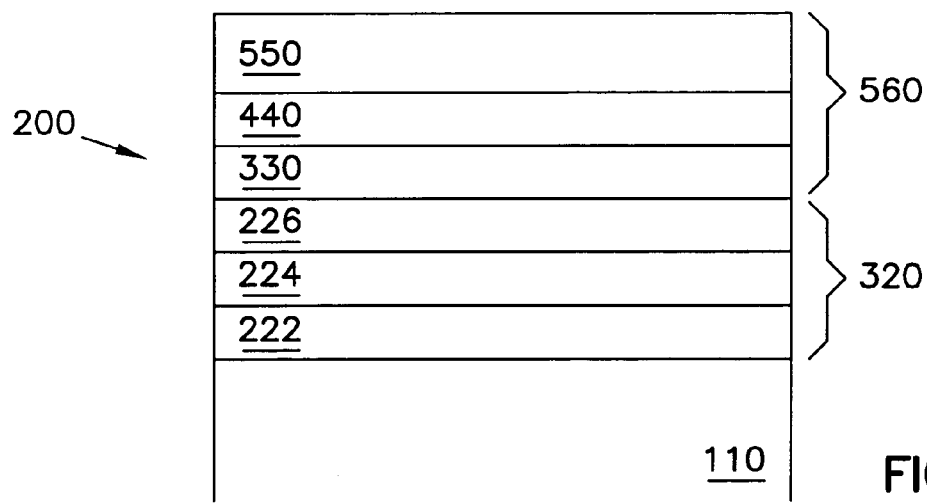

FIG. 5 shows device 100 after a photoresist layer 550 is formed over cap layer 440. Photoresist layer 550 can be formed by known process. The combination of amorphous carbon layer 330, cap layer 440, and photoresist layer 550 forms a masking structure 560. In some embodiments, masking structure 560 includes an additional layer formed between cap layer 440 and photoresist layer 550; the additional layer serves as an antireflective layer to enhance the photo processing performance. Masking structure 560 is used as a mask to etch one or more layers underneath masking structure 560 in subsequent processes.

Figure 6:
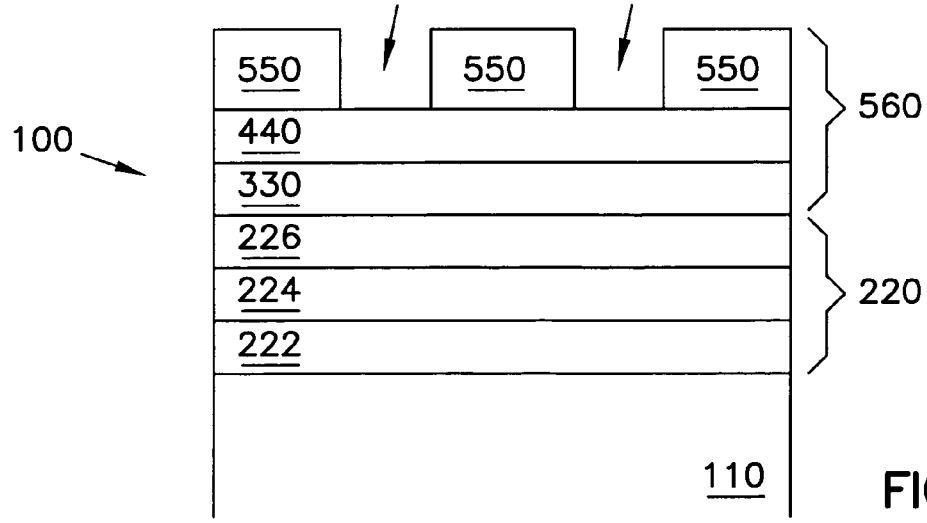

FIG. 6 shows device 100 after photoresist layer 550 is patterned. Patterning photoresist layer 550 can be performed using known techniques. The patterned photoresist layer 550 has openings 601.

Figure 7:
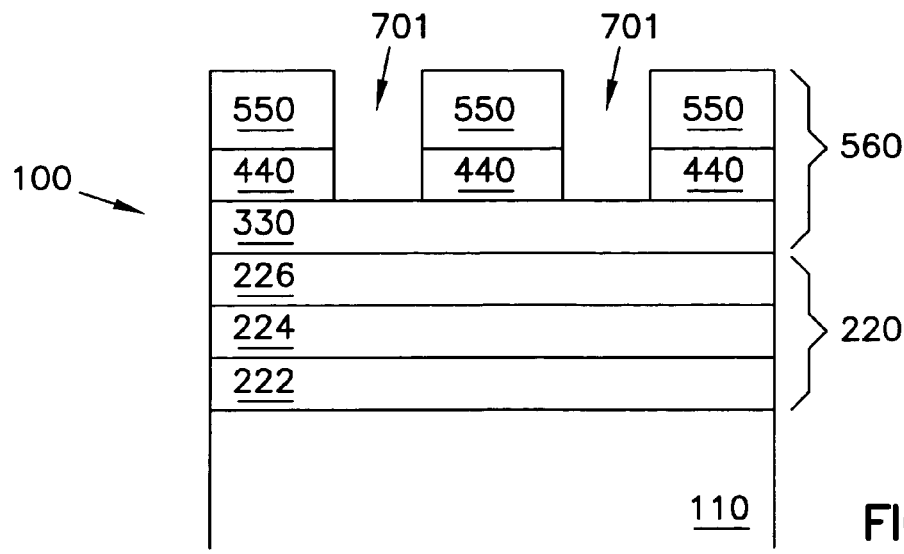

FIG. 7 shows device 100 after cap layer 440 is patterned. In some embodiments, an oxygen plasma etch process is performed to pattern cap layer 440 using photoresist layer 550 as a mask. After cap layer 440 is patterned, the patterned cap layer 440 has openings 701 continuous or aligned with openings of the patterned photoresist layer 550. FIG. 7 shows patterned photoresist still remains after cap layer 440 is patterned. In some embodiments, however, patterned photoresist layer 550 is removed such that within masking structure 560, only patterned cap layer 440 and amorphous carbon layer 330 remain.

Figure 8:
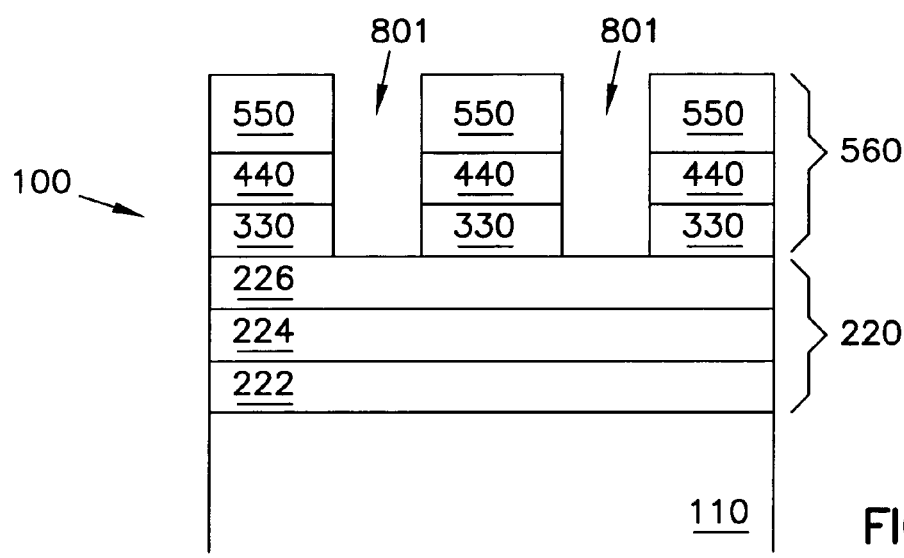

FIG. 8 shows device 100 after amorphous carbon layer 330 is patterned. In some embodiments, amorphous carbon layer 330 is patterned in an etching process such as an oxygen plasma etching process using the patterned cap layer 440 as a mask. The patterned amorphous carbon layer 330 has openings 801 continuous or aligned with openings 801 of the patterned cap layer 440.

Figure 9:
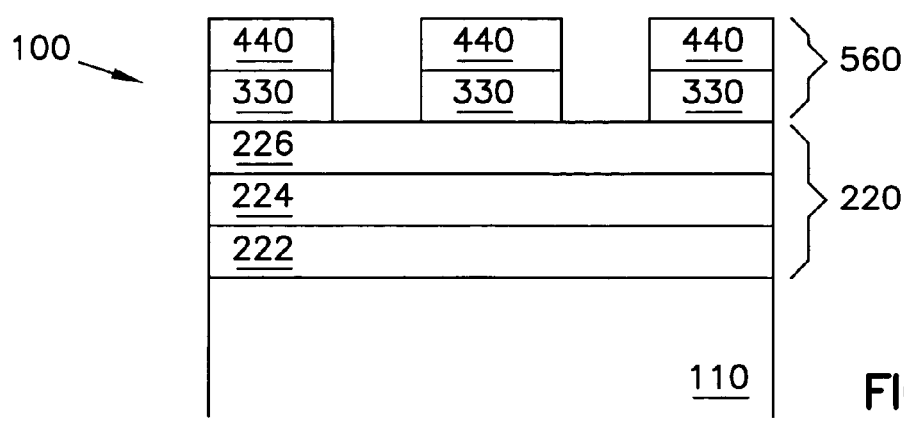

FIG. 9 shows device 100 after photoresist layer 550 is removed. The combination of the remaining cap layer 440 and amorphous carbon layer 330 is used as a mask to etch a portion of device structure 220, or the entire device structure 220, or the entire device structure 220 and at least a portion of substrate 210. In some embodiments, both photoresist layer 550 and cap layer 440 are removed after amorphous carbon layer 330 is patterned. Thus, only amorphous carbon layer 330 remains and is used as a mask to etch the layers underneath amorphous carbon layer 330.

Figure 10:
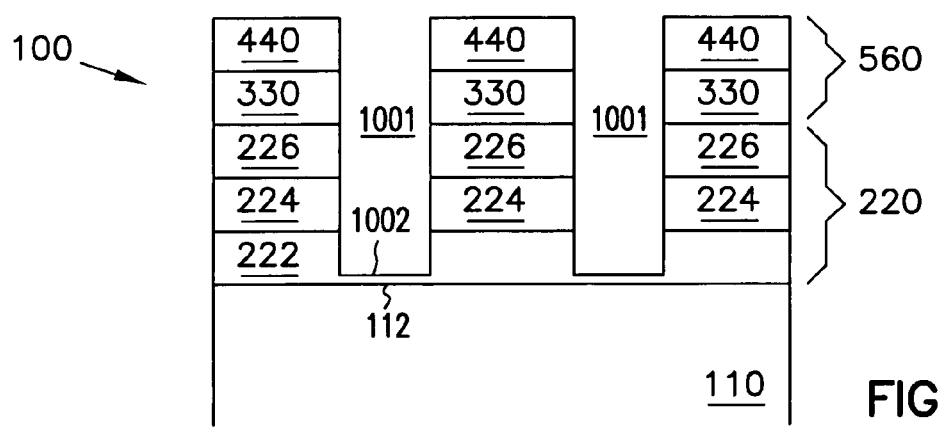

FIG. 10 shows device 100 after device structure 220 is etched. Device structure 220 is etched using cap layer 440 and amorphous carbon layer 330 as a mask. Trenches 1001 are formed as a result of the etching process. In embodiments represented by FIG. 8, trenches 1001 are formed in at least portion of device structure 220. In some embodiments, trenches 1001 are formed in the entire device structure 220 and in at least a portion of substrate 210.

Layer 222 is etched to a level 1002. Level 802 is any level that is above surface 112 of substrate 210. In embodiments represented by FIG. 8, device structure 220 is etched such that the etching process penetrates through layers 226 and 224 and partially into layer 222 and stops at level 1002 as shown in FIG. 8. However, in some embodiments, device structure 220 is etched such that level 802 can be anywhere in device structure 220. In other embodiments, the etching process penetrates through all layers 222, 224, and 226 and stops at or below surface 112 of substrate 210. The level at which the etching process etches into device structure 220 depends on what will be formed after device structure 220 is etched. For example, device structure is etched to one level if conductive interconnects will be formed and at another level if a component such as a capacitor will be formed.

Figure 11:
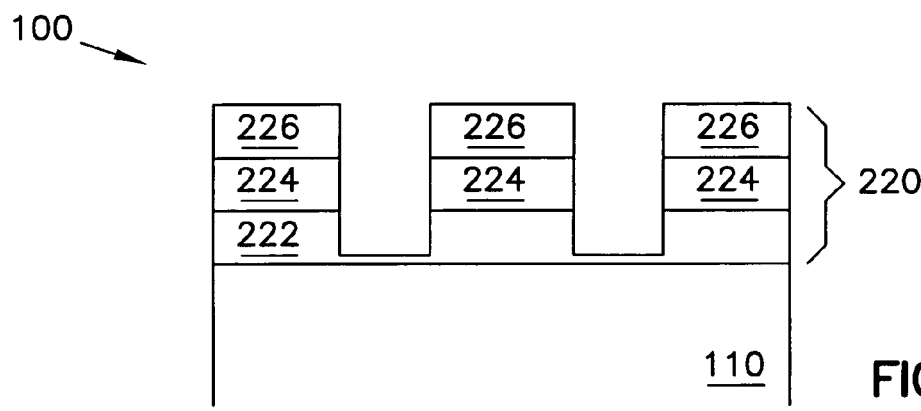

FIG. 11 shows device 100 after cap layer 440 and amorphous carbon layer 330 are removed. Cap layer 440 can be removed by a process such as an oxygen plasma process. Amorphous carbon layer 330 can be removed by a process such as an ash process. In some embodiments, amorphous carbon layer 330 is removed using an ash process with oxygen plasma or with a combination of oxygen plasma and $CF_4$.

In the above description of FIG. 3 through FIG. 11, amorphous carbon layer 330, which is transparent in visible light range, is included in masking structure 560 to use as a mask to etch device structure 220. In some embodiments, an amorphous carbon layer such as amorphous carbon layer 330 is also included in device structure 220. For example, one of the layers 222, 224, and 226 of device structure 220 may be an amorphous carbon layer such as amorphous carbon layer 330. As another example, device structure 220 may include an additional layer besides layer 222, 224, and 226 in which the additional layer is an amorphous carbon layer such as amorphous carbon layer 330.

In embodiments where an amorphous carbon layer exists within device structure 220, the amorphous carbon layer within device structure 220 may be used for insulating purposes, antireflection purposes, or for other purposes. Hence, in embodiments where device structure 220 includes an amorphous carbon layer similar to amorphous carbon layer 330, the amorphous carbon layer of device structure 220 still remains after amorphous carbon layer 330 of masking structure 560 is removed.

After amorphous carbon layer 330 is removed as shown in FIG. 10, other processes can be performed to device 100 to form components such as transistors, capacitors, memory cell, or an integrated circuit such as a memory device, a processor, an application specific integrated circuit, or other types of integrated circuits.

In the description of FIG. 1-FIG. 11, device structure 220 may include multiple layers of different materials with different properties. Thus, for different materials in device structure 220, a different masking structure with different materials may be needed to etch device structure 220 such that the materials in the device structure are not affected by the etching process.

In the description above of FIG. 1-FIG. 11, masking structure 560 includes amorphous carbon layer 330 and cap layer 440 in which the cap layer 440 can be formed from different materials such as the non-oxide materials. Since amorphous carbon layer 330 is formed form amorphous carbon, it has a relatively high resistance. Thus, amorphous carbon layer provides a suitable etch selectivity to multiple layers of dielectric material and metal material within device structure 220. Since cap layer 440 may be formed from different types of non-oxide materials, cap layer 440 can be formed with different materials to suit different materials of device structure 220. Thus, the combination of amorphous carbon layer 330 and the different materials of cap layer 440 allows masking structure 560 to be a suitable mask to selectively etch different materials of a device structure such as device structure 220.

Further, when cap layer 440 is in situ deposited together with amorphous carbon layer 330, time and cost may be reduced. In addition, the recipe for forming amorphous carbon layer 330, or cap layer 440, or both may adjusted (selected) to affect the optical property of one or both layers 230 and 440 to improve the reading of the alignment marks on substrate 210. For example, the recipe for amorphous carbon layer 330 or cap layer 440 or both may selected such that one or both of these layers has a low absorption of light to improve the reading of alignment marks such as alignment marks 114 on substrate 210.

Figure 12:
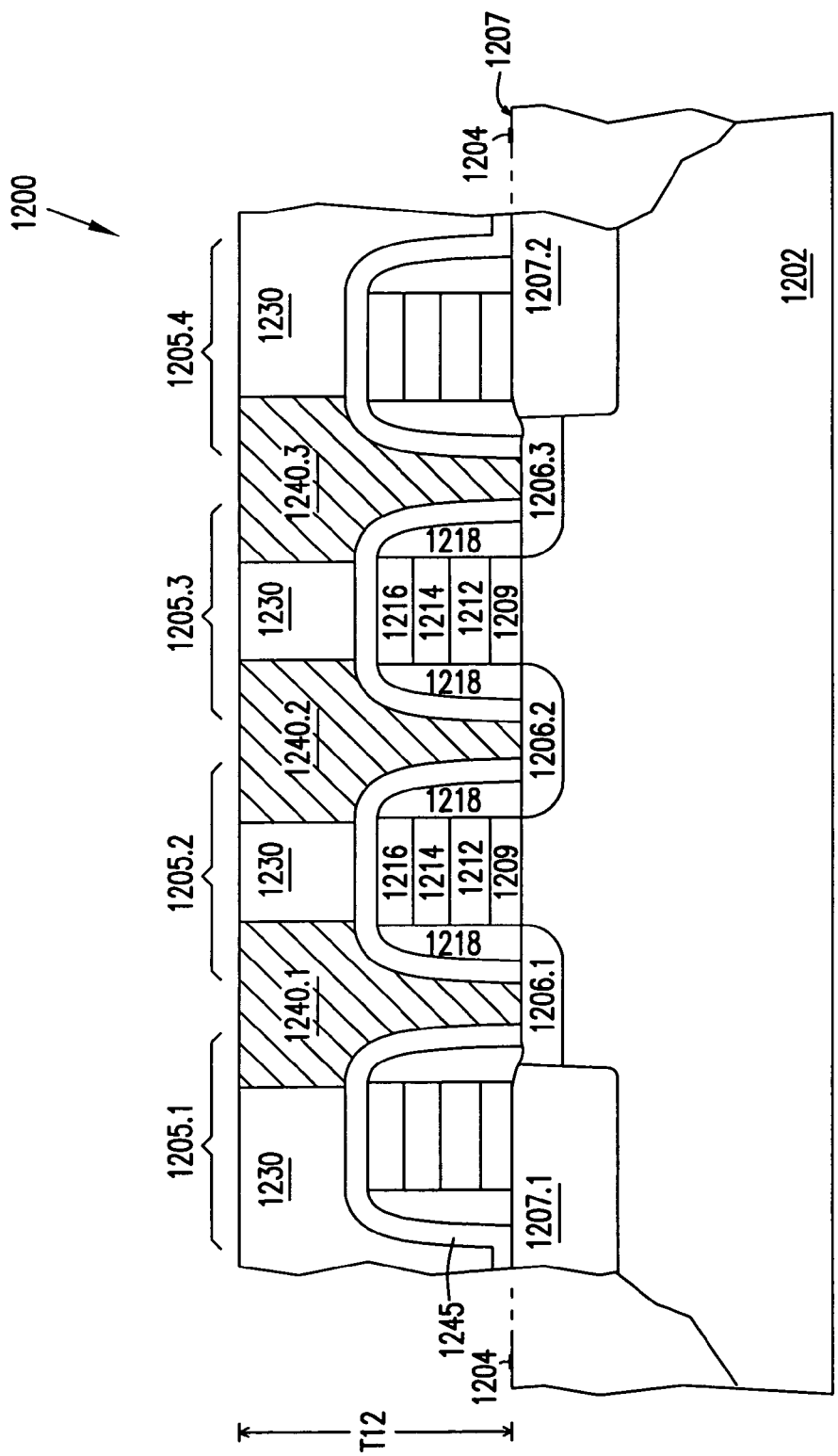
FIG. 12 through FIG. 23 show cross-sections of a memory device during various processing stages according to embodiments of the invention.

FIG. 12 through FIG. 23 show cross-sections of a memory device 1200 during various processing stages according to embodiments of the invention. In FIG. 12, memory device 1200 includes a substrate 1202 having alignment marks 1204 formed on surface 1207 of substrate 1202. A number of surface structures (gate structures) 1205 (1205.1 through 1205.4) are formed over substrate 1202. Within substrate 1202, a number of diffusion regions 1206 (1206.1 through 1206.3) and isolation structures 1207.1 and 1207.2 are formed. For clarity, FIG. 12 shows alignment marks 1204 without elements formed above alignment marks 1204. However, elements such as the layers shown in FIG. 12 may be formed over alignment marks 1204.

Memory device 1200 also includes an insulating layer 1230 and a number of contacts 1240 (1240.1 through 1240.3) extending through insulating layer 1230. Each of the contacts 1240 connects to one of the diffusion regions 1206. A barrier layer 1245 separates surface structures 1205 from insulating layer 1230 and contacts 1240. Contacts 1240 are made of conducting material to provide electrical connections for diffusion regions 1206. Barrier layer 1245 can be oxide, or nitrite, or other non-conducting materials to prevent cross-diffusion of materials between surface structures 1205 and insulating layer 1230. In some embodiments, barrier layer 1245 is omitted. Insulating layer 1230 provides insulation between the contacts 1240. Insulating layer 1230 can be a layer of silicate glass doped with one or more dopants such as boron and phosphorous or other types of doped glasses. For example, insulating layer 1230 can be Boronsilicate glass (BSG), or Phosphosilicate glass (PSG). In embodiments represented by FIG. 12, insulating layer 1230 includes Borophosphosilicate glass (BPSG) and has a thickness T12. In some embodiments, T12 is in the range of 2000 Angstroms to 5000 Angstroms.

In embodiments represented by FIG. 12, substrate 1202 includes silicon doped with a dopant, for example boron, to make it a P-type material. Diffusion regions 1206 are doped with a dopant, for example phosphorous, to make them an N-type material. In some embodiments, substrate 1202 can be an N-type material and diffusion regions 1206 can be a P-type material.

Each of the gate structures 1205 includes a number of elements: a gate dielectric (gate oxide) 1209, a doped polysilicon layer 1212, a silicide layer 1214, a capping dielectric layer 1216, and dielectric spacers 1218. Silicide layer 1214 can include a compound of metal and silicon such as titanium silicide, tungsten silicide, and others. All dielectrics in gate structures 1205 can include material such as silicon oxide. Each of the gate structures 1205 is also referred to as a word line. The structure of FIG. 12 can be formed using known techniques.

Figure 13:
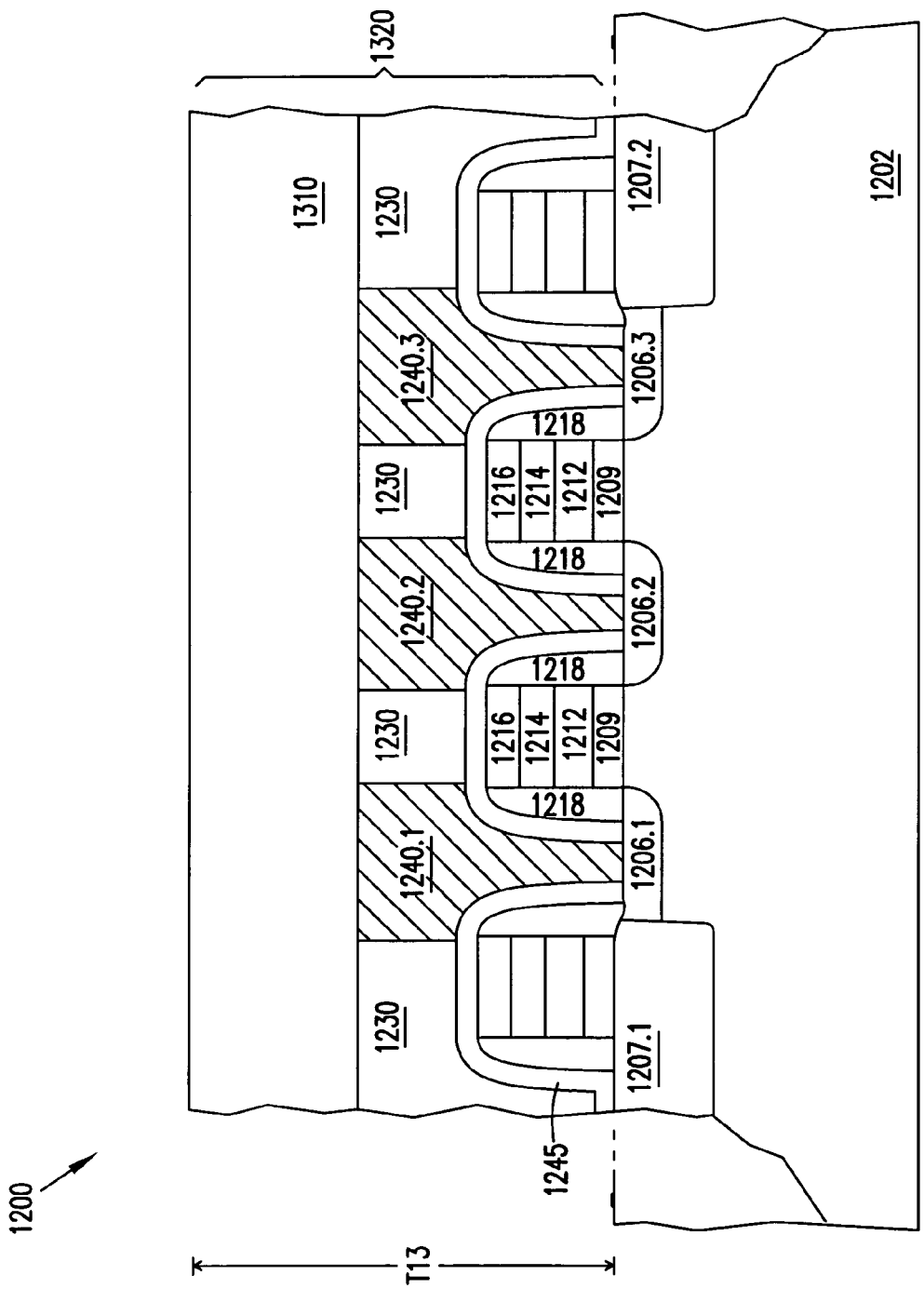

FIG. 13 shows memory device 1200 after an insulating layer 1310 is formed. Insulating layer 1310 can include BSG, PSG, or BPSG similar to insulating layer 1230. Insulating layer 1310 and other structures in FIG. 12 form a device structure 1320. Device structure 1320 has a thickness T13. In some embodiments, T13 is at least 40000 Angstroms.

Figure 14:
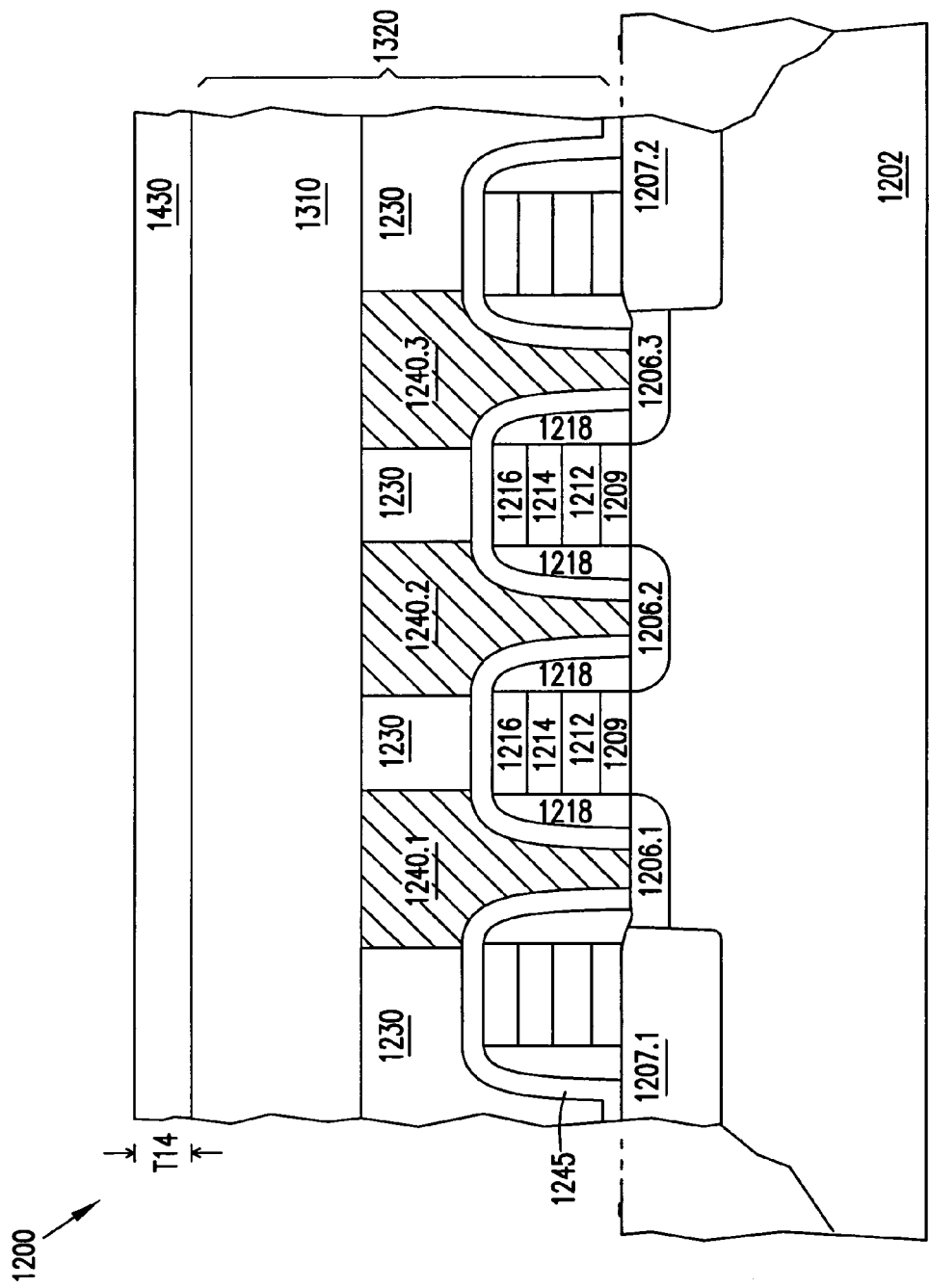

FIG. 14 shows memory device 1200 after a mask 1430 is formed over device structure 1320. Mask 1430 may include amorphous carbon. Thus, mask 1430 is also referred to as amorphous carbon layer 1430. In some embodiments, amorphous carbon layer 1430 has a low absorption coefficient such that amorphous carbon layer 1430 is transparent in visible light range. In some embodiments, amorphous carbon layer 1430 has an absorption coefficient (k) between about 0.8 and 0.001 at a wavelength of 633 nanometers. In other embodiments, amorphous carbon layer 1430 is a transparent amorphous carbon layer in which the transparent amorphous carbon layer has an absorption coefficient (k) between about 0.15 and 0.001 at a wavelength of 633 nanometers. Amorphous carbon layer 1430 may be formed by a method similar to method of forming amorphous carbon layer 330 described in FIG. 4.

Since amorphous carbon layer 1430 is transparent in visible light range, amorphous carbon layer 1430 may be formed at a selected thickness to properly etch device structure 1320 without substantially affecting the reading of the alignment marks 1204 during an alignment of device 1200. Amorphous carbon layer 1430 has a thickness T14, which can be selected at an appropriate value to properly etch device structure 1320. T14 can be any thickness. In some embodiments, T14 is at least 4000 Angstroms.

Figure 15:
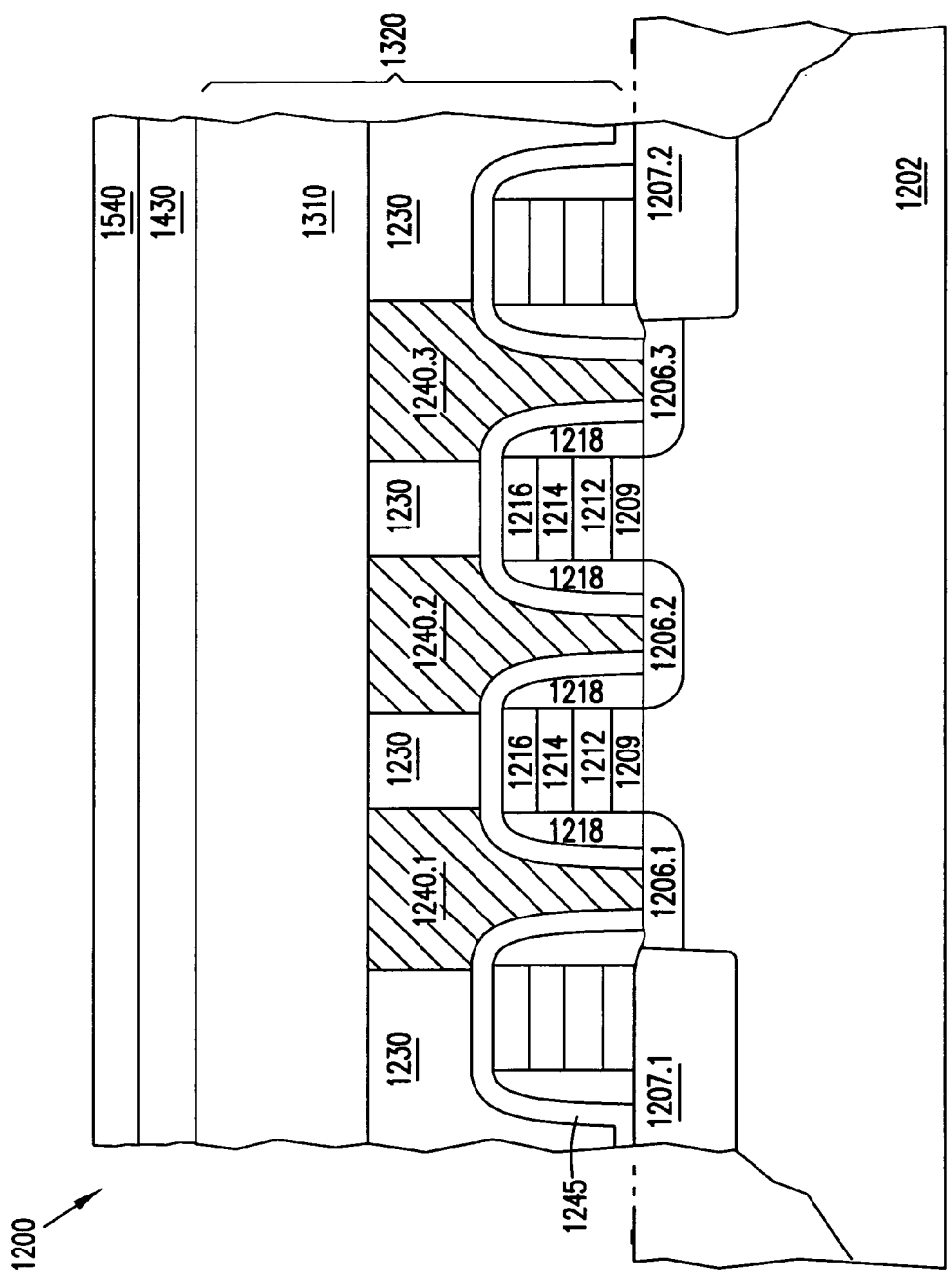

FIG. 15 shows memory device 1200 after a cap layer 1540 is formed over amorphous carbon layer 1430. Cap layer 1540 includes non-oxide materials such as boron carbide ($B_xC$), boron nitride (BN), silicon carbide (SiC), silicon nitride ($Si_xN_y$), fluorine doped with oxide (e.g., $SiO_x$:F), fluorine doped with nitride (e.g., $Si_xN_y$:F), fluorine doped with carbide (e.g., SC:F), and fluoride films such as $CaF_x$ and $MgF_x$. In some embodiments, hydrogen is incorporated into the non-oxide materials of cap layer 1540. Cap layer 1540 can be formed by a process such as CVD or PECVD process. In some embodiments, cap layer 1540 is formed together with amorphous carbon layer 1430 in the same process (same processing step) such that cap layer 1540 is situ deposited over amorphous carbon layer 1430. For example, during or after amorphous carbon layer 1430 is formed in a CVD or PECVD process similar to the process of described in FIG. 4, a gas including boron such as $B_2H_6$, $B_4H_{10}$, and $BH_3CO$ can be introduce to the chamber to form cap layer 1540 having boron carbide over the amorphous carbon layer 1430. In some embodiments, cap layer 1540 includes boron carbide with about 0.5 atomic percent to about 70 atomic percent of boron.

Figure 16:
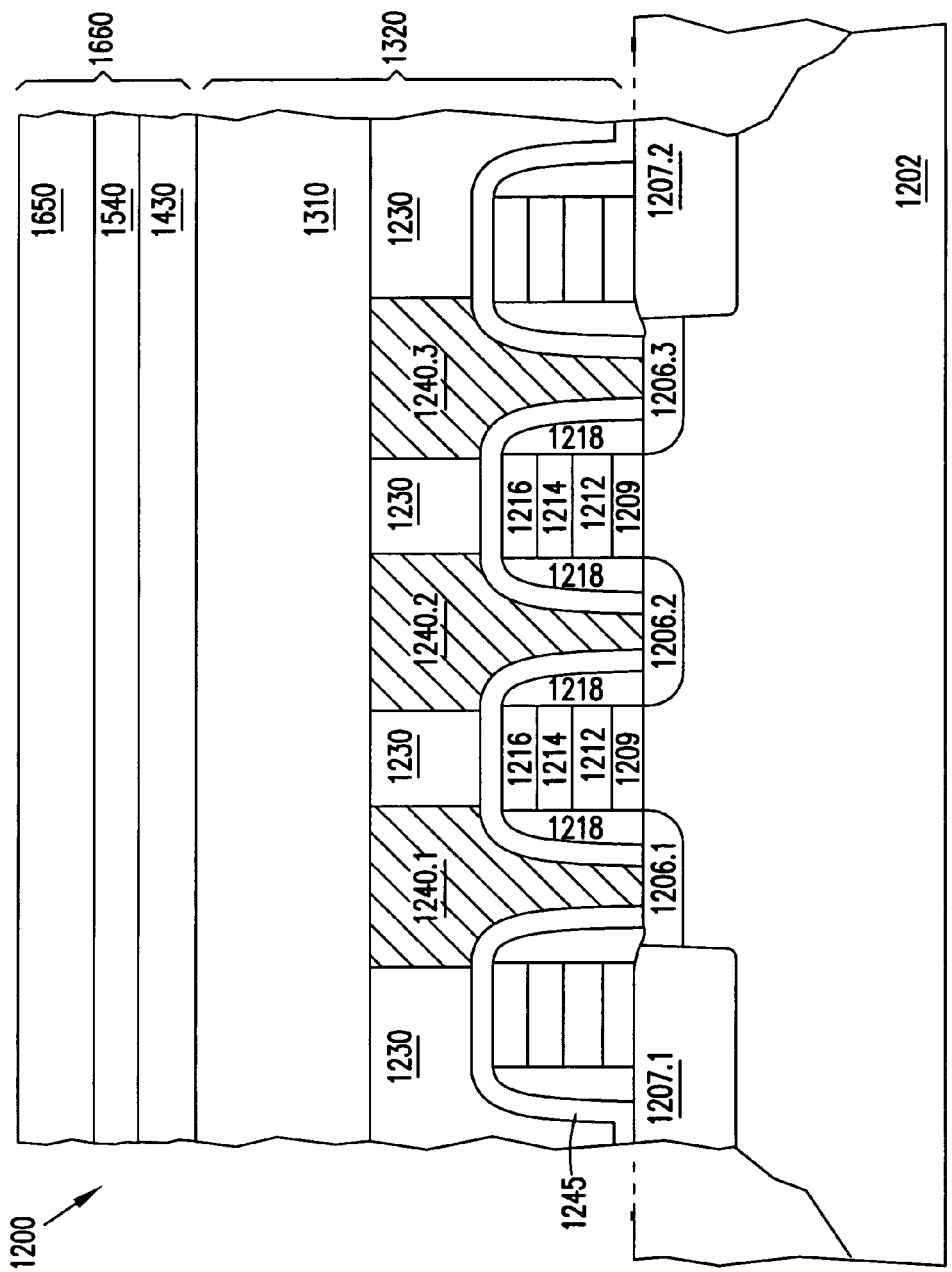

FIG. 16 shows device 1200 after a photoresist layer 1650 is formed over cap layer 1540. Photoresist layer 1650 can be formed by a known process. The combination of amorphous carbon layer 1430, cap layer 1540, and photoresist layer 1650 forms a masking structure 1660. In some embodiments, masking structure 1540 includes an additional layer formed between cap layer 1540 and photoresist layer 1650; the additional layer serves as an antireflective layer to enhance the photo processing performance. Masking structure 1660 is used as mask to etch one or more layers underneath masking structure 1660 in subsequent processes.

Figure 17:
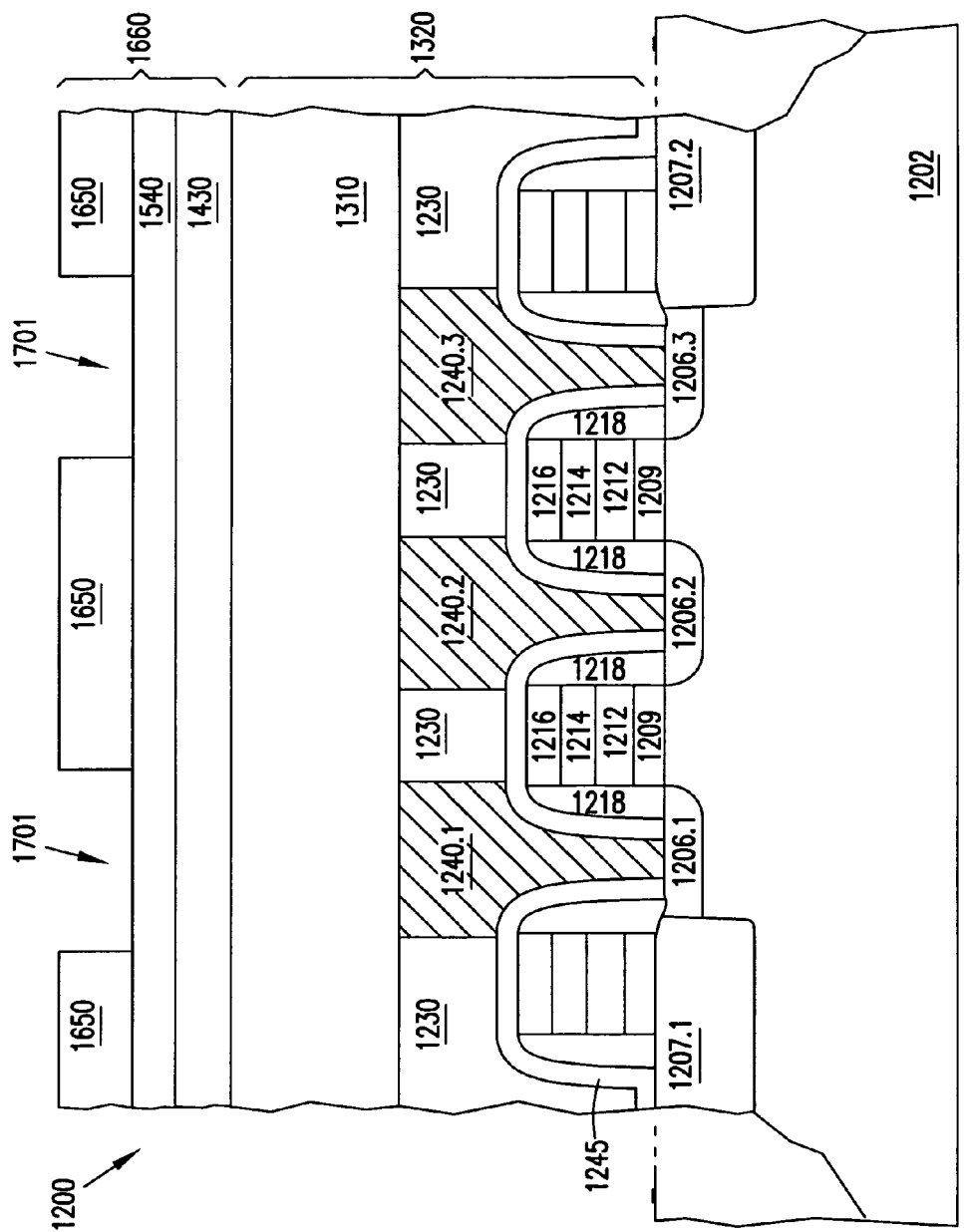

FIG. 17 shows device 1200 after photoresist layer 1650 is patterned. Patterning photoresist layer 1650 can be performed using known techniques. The pattern photoresist layer 1650 has openings 1701.

Figure 18:
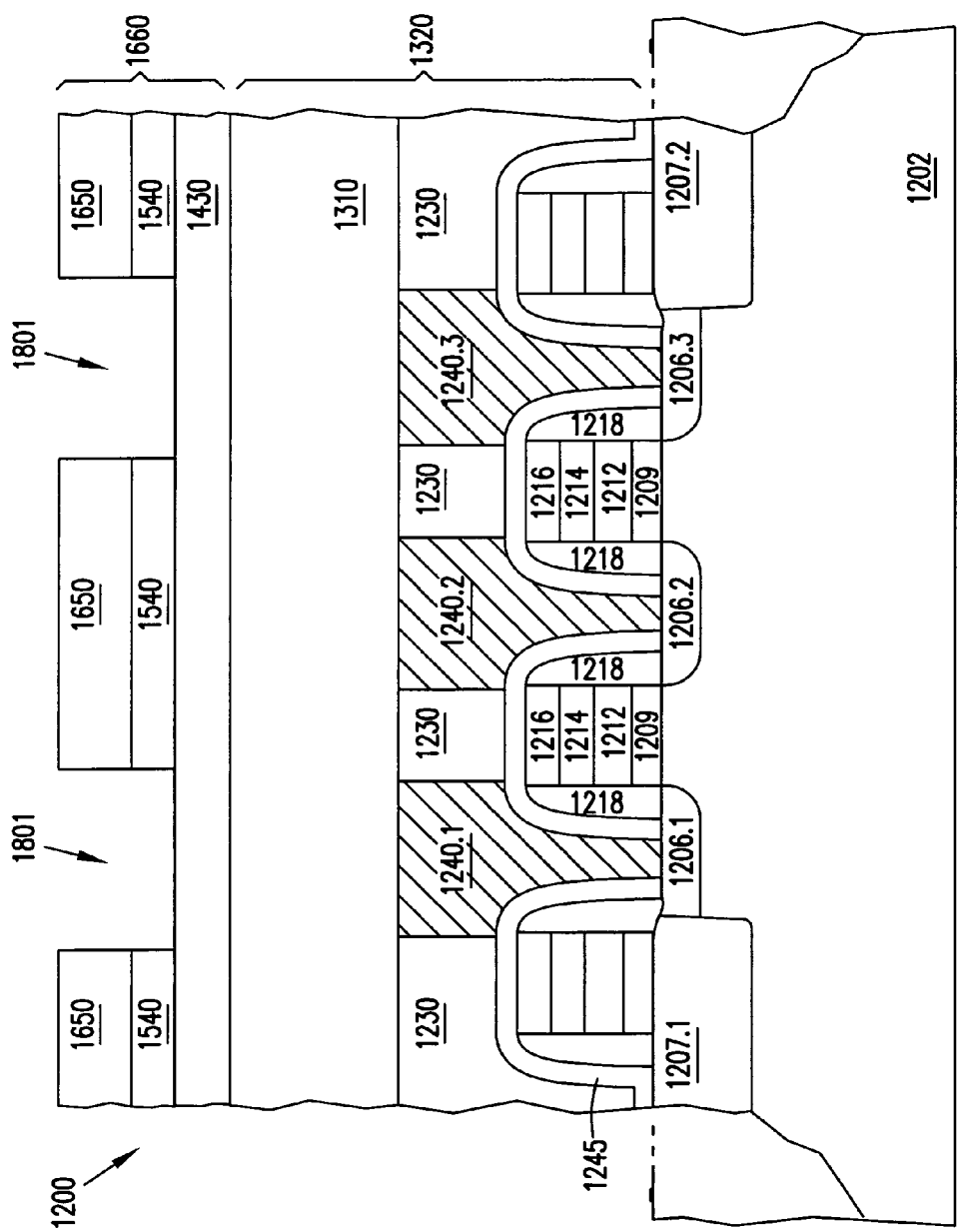

FIG. 18 shows device 1200 after cap layer 1540 is patterned. In some embodiments, cap layer 1540 is patterned in an etching process such as an oxygen plasma etching process using photoresist layer 1650 as a mask. After cap layer 1540 is patterned, the patterned cap layer 1540 has openings 1801 continuous or aligned with openings of the patterned photoresist layer 1650. FIG. 17, shows patterned photoresist still remains after cap layer 1540 is patterned. In some embodiments, however, patterned photoresist layer 1650 is such that within masking structure 1660, only patterned cap layer 1540 and amorphous carbon layer 1430 remain.

Figure 19:
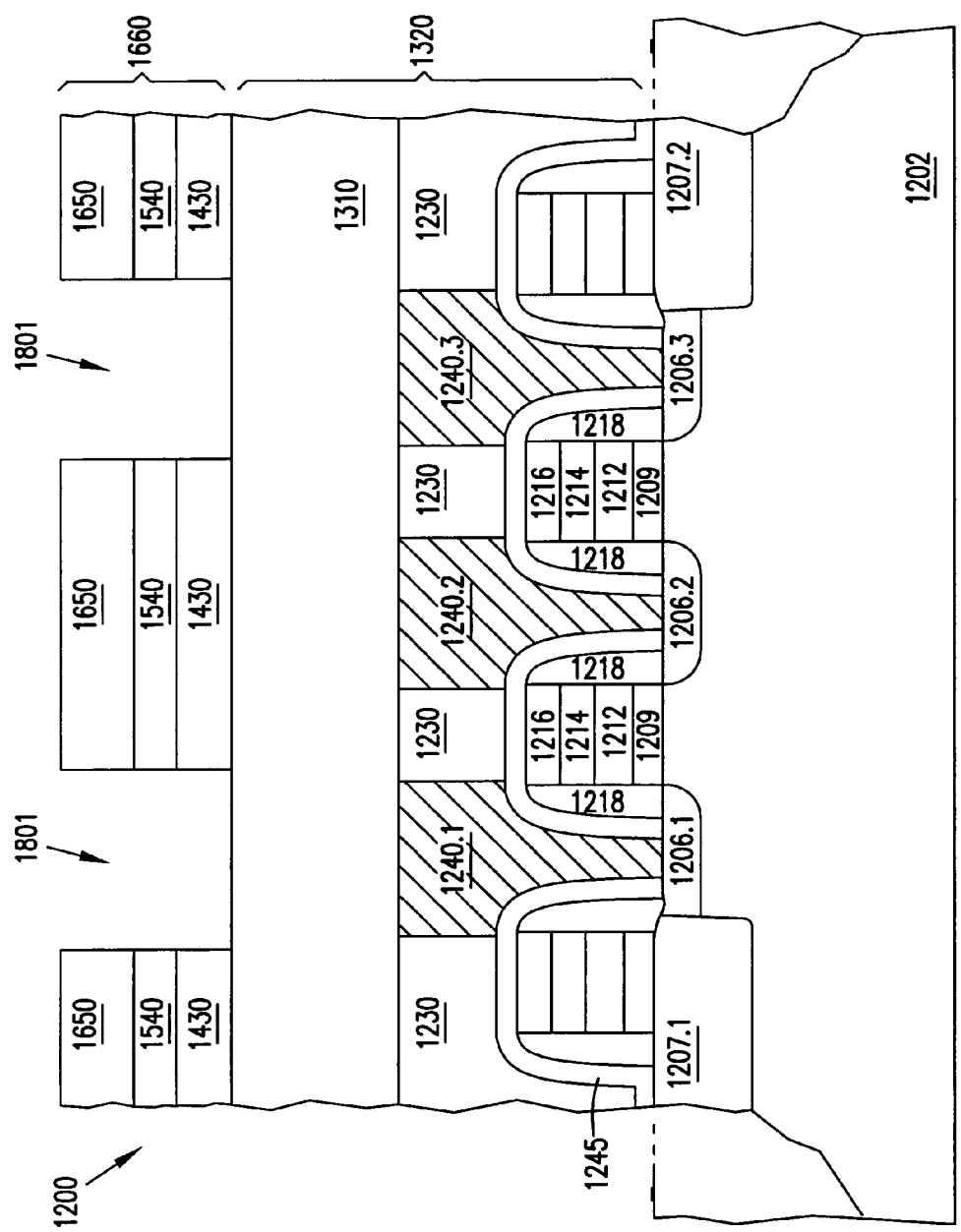

FIG. 19 shows device 1200 after amorphous carbon layer 1430 is patterned. In some embodiments, amorphous carbon layer 1430 is patterned in an etching process such as an oxygen plasma etching process using the patterned cap layer 1540 as a mask. The patterned amorphous carbon layer 1430 has openings 1901 continuous or aligned with openings of the patterned cap layer 1540.

Figure 20:
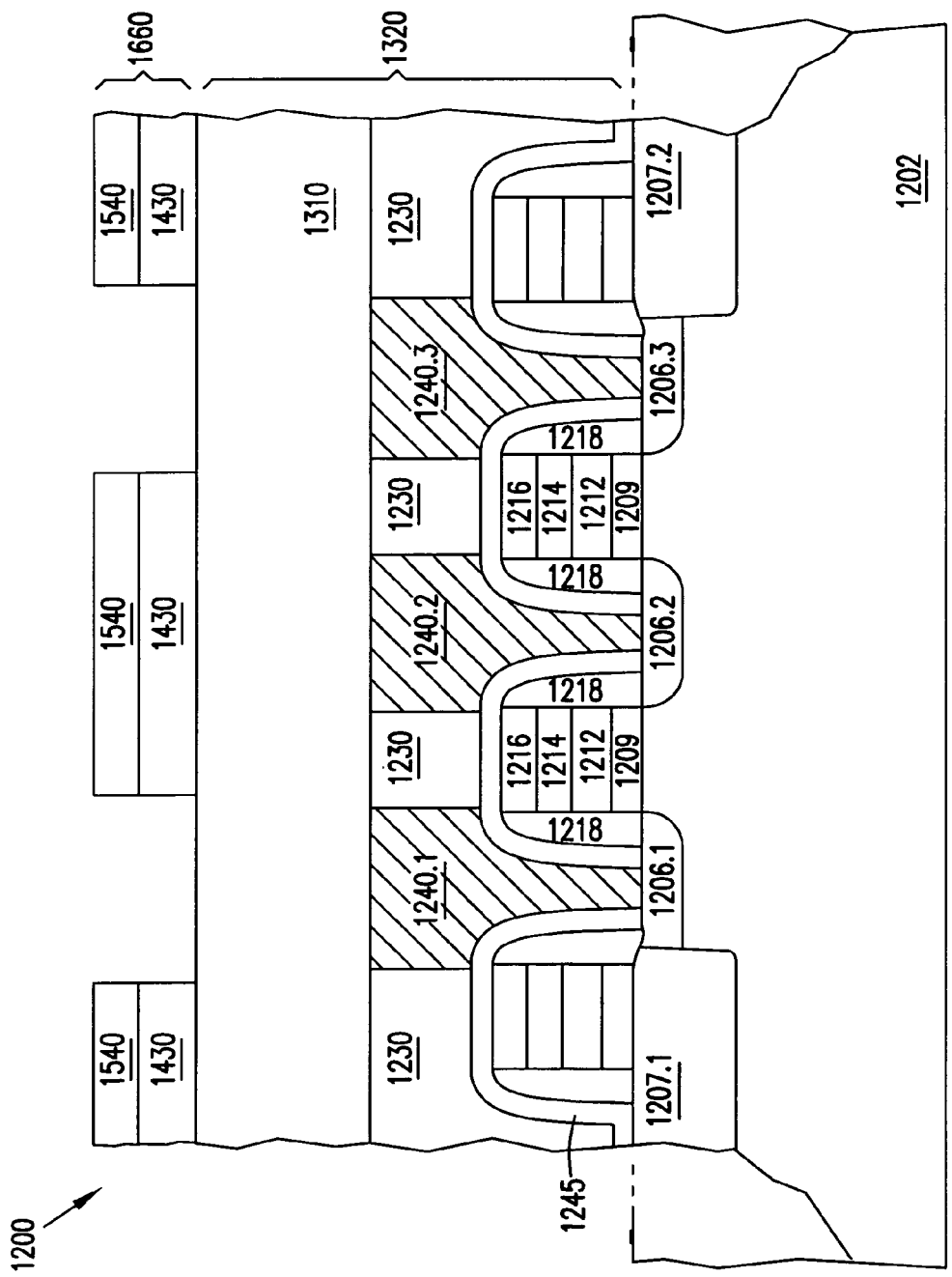

FIG. 20 shows device 1200 after photoresist layer 1650 is removed. The combination of the remaining cap layer 1340 and amorphous carbon layer 1430 is used as a mask to etch a portion of device structure 1320, or the entire device structure 1320, or the entire device structure 1320 and at least a portion of substrate 1202. In some embodiments, both photoresist layer 1650 and cap layer 1540 are removed after amorphous carbon layer 1430 is patterned. Thus, only amorphous carbon layer 1430 remains and is used as a mask to etch the layers underneath amorphous carbon layer 1430.

Figure 21:
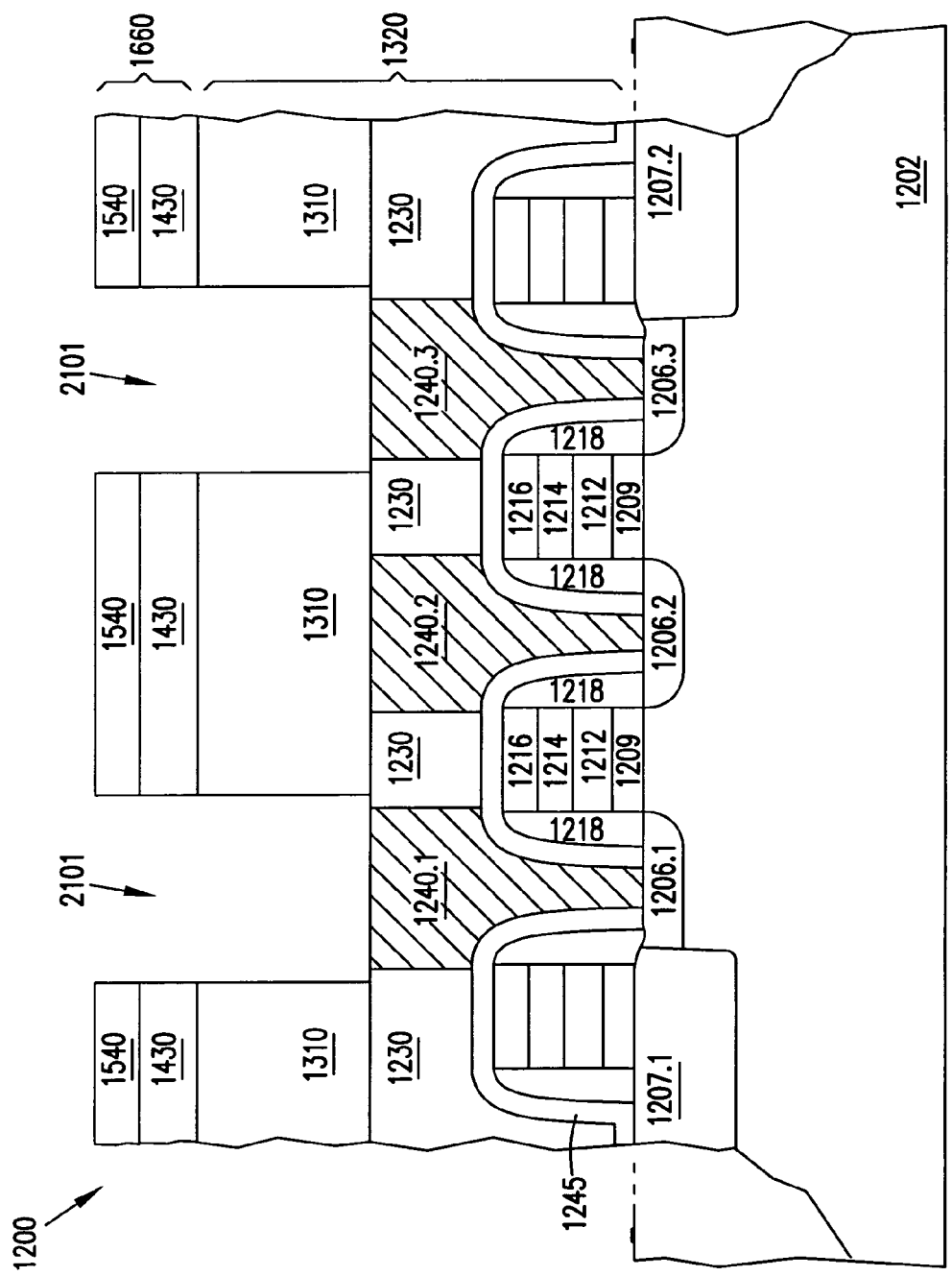

FIG. 21 shows device 1200 after device structure 1320 is etched. Device structure 1320 is etched using cap layer 1540 and amorphous carbon layer 1430 as a mask. The etched device structure 1320 has openings 2101.

Figure 22:
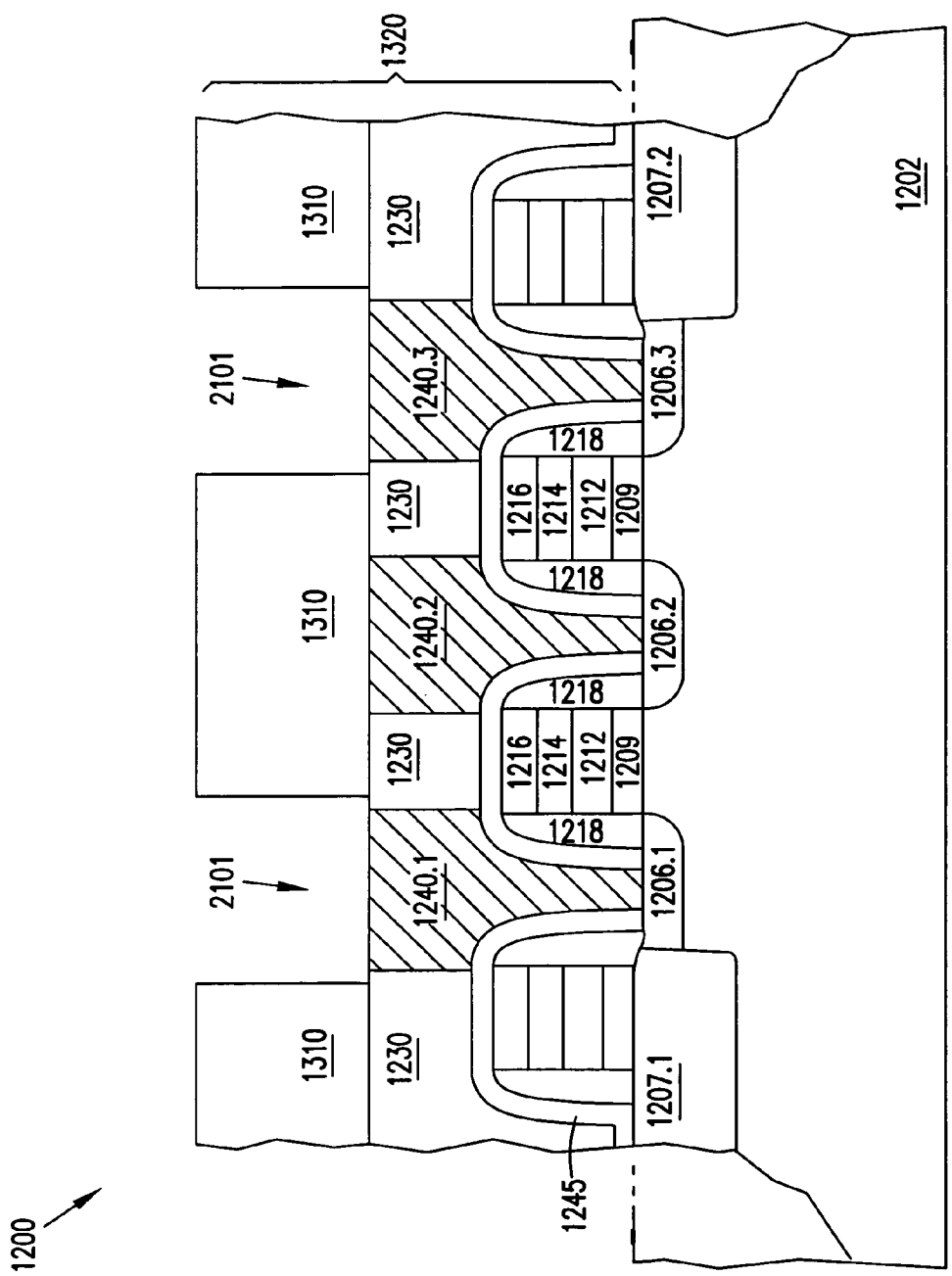

FIG. 22 shows device 1200 after cap layer 1540 and amorphous carbon layer 1430 are removed. The process of removing cap layer 1540 and amorphous carbon layer 1430 is similar to that of cap layer 440 and amorphous carbon layer 330 of FIG. 11.

Figure 23:
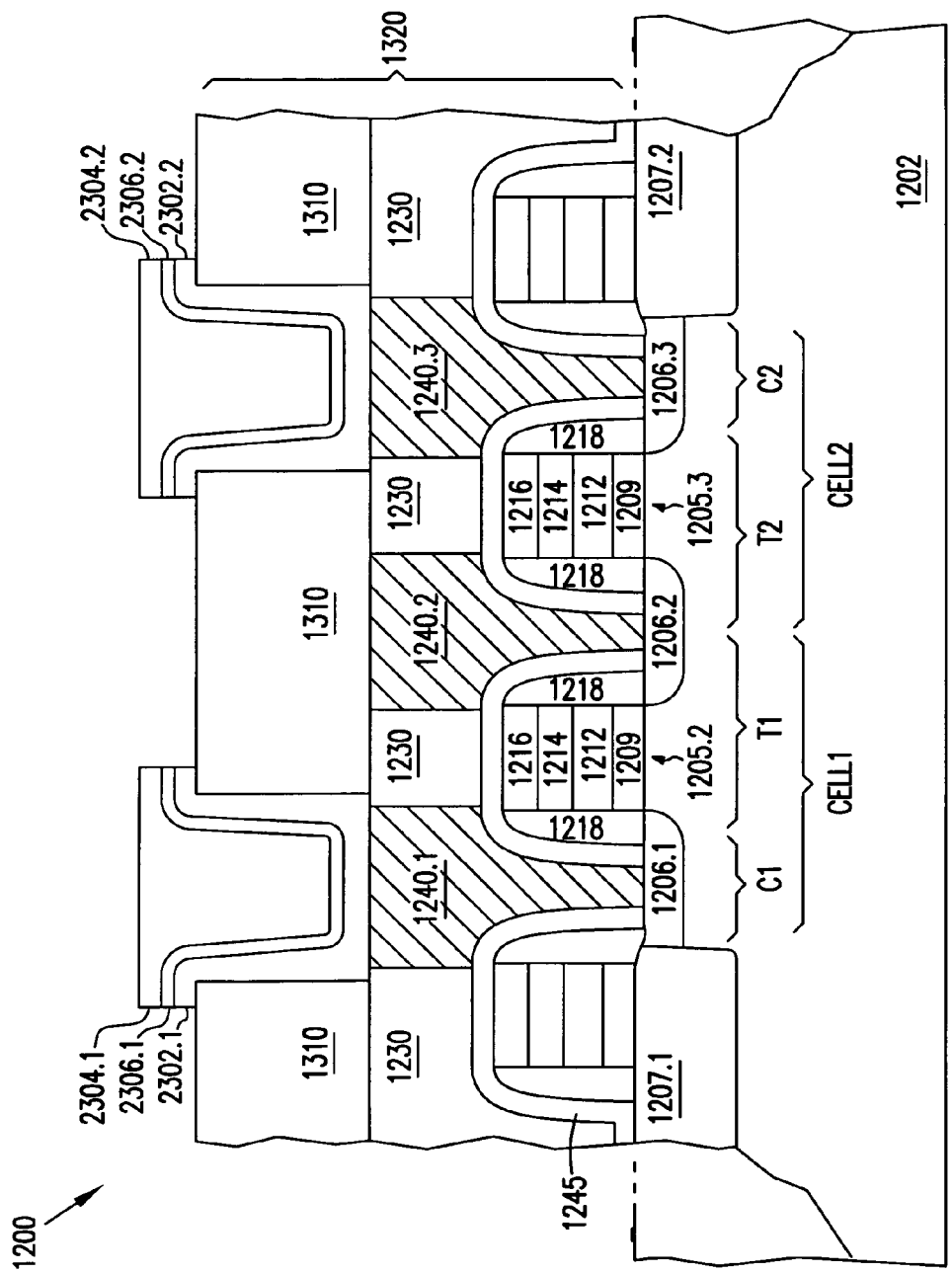

FIG. 23 shows device 1200 after other layers are formed using known techniques. In each of the openings 2101, a first conductive layer 2302 (2302.1 and 2302.2), a second conductive layer 2304 (2304.1 and 2304.2), and a dielectric layer 2306 (2306.1 and 2306.2) are formed. Conductive layers 2302, 2304, dielectric layer 2306 and other elements form storage capacitors C1 and C2. For example, in storage capacitor C1, conductive layer 2302.1, contact 1240.1, and diffusion region 1206.1 form a first capacitor plate (bottom plate); conductive layer 2302.2 forms a second capacitor plate (top plate); and dielectric layer 2306.1 is the capacitor dielectric. In some embodiments, conductive layers 2304 connect to common a cell plate of memory device 1200. The common cell plate is omitted from FIG. 19 for simplicity.

Memory device 1200 includes access transistors T1 and T2. Gate structure 1205.2 and diffusion regions 1206.1-1206.2 form access transistor T1. Gate structure 1205.3 and diffusion regions 1206.2-1206.3 form access transistor T2. Access transistor T1 and storage capacitor C1 form a memory CELL1. Access transistor T2 and storage capacitor C2 form a memory CELL2.

Memory cells CELL1 and CELL2 store data in form of charge in storage capacitors C1 and C2. The charges are transferred to and from doped regions 1206.1 and 1206.3 of capacitors C1 and C2 via contact 1240.2. In some embodiments, contact 1240.2 is a buried bit line contact, which connects to a bit line of memory device 1200.

In other embodiments, other elements having structures different from the structures of the layers 2302, 2304, and 2306 can be formed in openings 2101 (FIG. 21). For example, interconnects instead of capacitor plates can be formed in openings 2101 to connect diffusion regions 1206 to other parts of memory device 1200.

Memory device 1200 may be a dynamic random access memory (DRAM) device. Examples of DRAM devices include synchronous DRAM commonly referred to as SDRAM, SDRAM II, SGRAM (Synchronous Graphics Random Access Memory), DDR SDRAM (Double Data Rate SDRAM), DDR II SDRAM, DDR III SDRAM, GDDR III SDRAM (Graphic Double Data Rate), and Rambus DRAMs. Memory device 1200 includes other elements, which are not shown for clarity.

Figure 24:
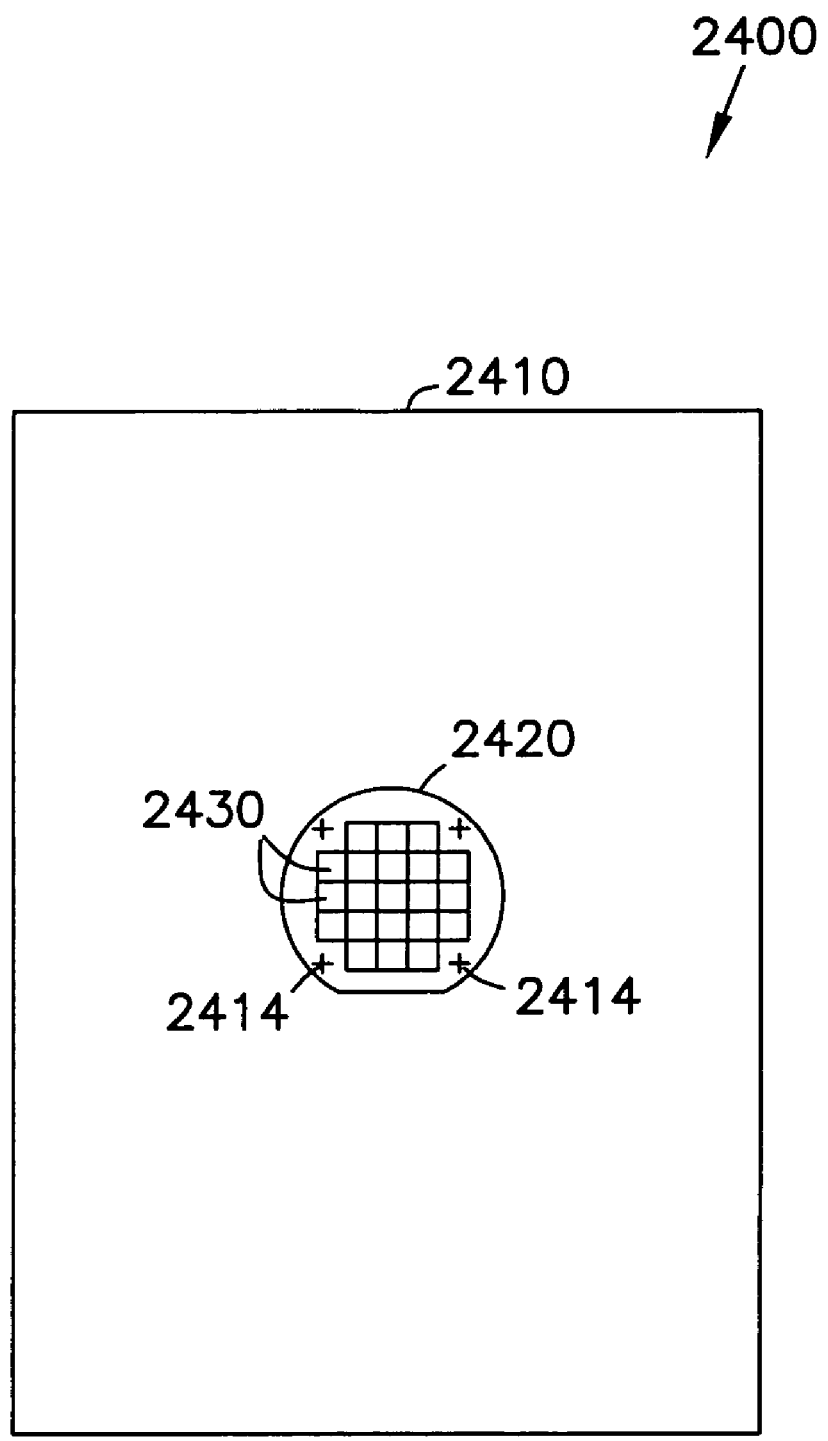
FIG. 24 shows a system according to an embodiment of the invention.

FIG. 24 shows a system according to an embodiment of the invention. System 2400 includes a chamber 2410 and a wafer 2420 placed in the chamber. In some embodiments, chamber 2410 is a PECVD chamber and wafer 2420 is a semiconductor wafer. An example of chamber 2410 includes a chamber of the Producer Processor available from Applied Materials, Inc. located in Santa Clara, Calif. Chamber 2410 and wafer 2420 can be used to form part of device 100 (FIG. 1-FIG. 11) and memory device 1200 (FIG. 12-23).

Wafer 2420 includes a number of alignment marks 2414 and a number of dice 2430. In some embodiments, alignment marks 2414 represent alignment marks 114 (FIG. 1) and alignment marks 1204 (FIG. 12).

At least one of the dice 2430 includes elements according to embodiments described in FIG. 2-FIG. 23 above. For example, at least one of the dice 2430 includes a substrate, a device structure, and a masking structure such as that of devices 100 and 1200 (FIG. 2-FIG. 23). Thus, at least one of the dice 2430 includes an amorphous carbon layer such as amorphous carbon layer 330 (FIG. 4) and amorphous carbon layer 1430 (FIG. 13) formed according to the process described in FIG. 2-FIG. 23.

A die such as one of the dice 2430 is a pattern on a semiconductor wafer such as wafer 2420. A die contains circuitry to perform a specific function. For, example, at least one of the dice 2430 contains circuitry for a device such as a processor, or memory device such as memory device 1200 (FIG. 11-FIG. 23).

CONCLUSION

Various embodiments of the invention provide a device having a masking structure and a method for forming the device. The masking structure includes an amorphous carbon layer on a cap layer. The amorphous carbon layer may be a transparent amorphous carbon layer. The cap layer includes non-oxide materials. Although specific embodiments are described herein, those skilled in the art recognize that other embodiments may be substituted for the specific embodiments shown to achieve the same purpose. This application covers any adaptations or variations of the present invention. Therefore, the present invention is limited only by the claims and all available equivalents.

What is claimed is:

1. A memory device comprising:
a substrate having a plurality of doped regions;
device structure formed over the substrate, the device structure including a plurality of gate structures, a plurality of contacts, each of the contacts being located between two gate structure and contacting one of the doped regions, and an insulating layer formed over the gate structures and the contacts; and
a masking structure formed over the substrate, the masking structure including an amorphous carbon layer and a cap layer, wherein the cap layer includes non-oxide materials.

2. The memory device of claim 1, wherein the cap layer includes one of boron carbide, boron nitride, silicon carbide, silicon nitride, fluoride films, fluorine doped with oxide, fluorine doped with nitride, and fluorine doped with carbide.

3. The memory device of claim 1, wherein the amorphous carbon layer is transparent in visible light range.

4. The memory device of claim 1, wherein the cap layer includes at least one opening.

5. The memory device of claim 4, wherein the amorphous carbon layer includes at least one opening aligned with the opening of the cap layer.

6. The memory device of claim 5, wherein the masking structure further includes a photoresist layer.

7. The memory device of claim 6, wherein the photoresist layer includes at least one opening continuous with the opening of the cap layer.

8. The memory device of claim 1, wherein the device structure further includes a barrier layer located between the gate structures and the contacts.

9. The memory device of claim 1, wherein the amorphous carbon layer has a thickness of at least 4000 Angstroms.

10. The memory device of claim 1, wherein the device structure has a thickness of at least 40000 Angstroms.

11. A memory device comprising:
a substrate having at least one alignment mark, and a plurality of doped regions;
a plurality of gate structures over the substrate;
an insulating layer over the gate structures;
a plurality of contacts, each of the contacts being located between two gate structures, each of the contacts extending through the insulating layer and contacting one of the doped regions;
an amorphous carbon layer over the substrate, wherein the amorphous carbon layer is transparent in visible light range for improving a reading of the alignment mark; and
a cap layer over the amorphous carbon layer, wherein the cap layer includes non-oxide materials.

12. The memory device of claim 11, wherein the insulating layer include a glass layer.

13. The memory device of claim 12, wherein one of the gate structures and a pair of doped regions of the plurality of doped regions are parts of a transistor.

14. The memory device of claim 13, wherein a first doped region of the pair of doped regions is a part of a capacitor plate.

15. The memory device of claim 14, wherein a second doped region of the pair of doped regions is coupled to a bit line via one of the contacts.

16. The memory device of claim 11 further comprising a photoresist layer over the cap layer.

17. The memory device of claim 16 further comprising an antireflective layer between the photoresist layer and the cap layer.

18. The memory device of claim 11, wherein the cap layer includes boron carbide.

19. The memory device of claim 11, wherein the cap layer includes silicon carbide.

20. The memory device of claim 11, wherein the cap layer includes boron nitride.

21. The memory device of claim 11, wherein the cap layer includes silicon nitride.

22. The memory device of claim 11, wherein the cap layer includes a fluoride film.

23. The memory device of claim 11, wherein the cap layer includes fluoride and nitride.

24. The memory device of claim 11, wherein the cap layer includes fluoride and carbide.

25. A memory device comprising:
a substrate having a plurality of doped regions;
a plurality of gate structures over the substrate;

a glass layer over the gate structures;
a barrier layer between the gate structures and the glass layer for preventing cross-diffusion between the gate structures and the glass layer;
a plurality of contacts, each of the contacts being located between two gate structures and contacting one of the doped regions;
an amorphous carbon layer over the substrate, wherein the amorphous carbon layer is transparent to radiation having wavelengths between 400 nanometers and 700 nanometers; and
a cap layer formed directly over the amorphous carbon layer, wherein the cap layer includes non-oxide materials.

26. The memory device of claim 25, wherein the cap layer includes boron carbide.

27. The memory device of claim 25, wherein the cap layer includes silicon carbide.

28. The memory device of claim 25, wherein the cap layer includes boron nitride.

29. The memory device of claim 25, wherein the cap layer includes silicon nitride.

30. The memory device of claim 25, wherein the cap layer includes a fluoride film.

31. The memory device of claim 25, wherein the cap layer includes fluoride and nitride.

32. The memory device of claim 25, wherein the cap layer includes fluoride and carbide.

33. The memory device of claim 25 further comprising a photoresist layer formed directly over the cap layer.

34. The memory device of claim 33, wherein the photoresist layer includes at least one opening.

35. The memory device of claim 34, wherein the cap layer includes at least one opening continuous with the opening of the photoresist layer.

36. The memory device of claim 35, wherein the amorphous carbon layer includes at least one opening continuous with the opening of the cap layer.

37. The memory device of claim 25, wherein one of the gate structures and a pair of doped regions of the plurality of doped regions are parts of a transistor.

38. The memory device of claim 37, wherein a first doped region of the pair of doped regions is a part of a capacitor plate.

39. The memory device of claim 38, wherein a second doped region of the pair of doped regions is coupled to a bit line via one of the contacts.

40. A method comprising:
forming a plurality of doped regions in a substrate of a memory device, the substrate including at least one alignment mark;
forming a plurality of gate structures over the substrate;
forming an insulating layer over the gate structures;
forming a plurality of contacts, each of the contacts being located between two gate structures, each of the contacts extending through the insulating layer and contacting one of the doped regions;
forming an amorphous carbon layer over the substrate, wherein the amorphous carbon layer is transparent in visible light range for improving a reading of the alignment mark; and
forming a cap layer over the amorphous carbon layer, wherein the cap layer includes non-oxide materials.

41. The method of claim 40, wherein forming the insulating layer includes forming the insulating layer from a glass material.

42. The method of claim 41, wherein one of the gate structures and a pair of doped regions of the plurality of doped regions are parts of a transistor.

43. The method of claim 42, wherein a first doped region of the pair of doped regions is a part of a capacitor plate.

44. The method of claim 43, wherein a second doped region of the pair of doped regions is coupled to a bit line of the memory device via one of the contacts.

45. The method of claim 40, wherein the cap layer is in situ deposited with the amorphous carbon layer.

46. The method of claim 40 further comprising:
forming a photoresist layer over the cap layer.

47. The method of claim 46 further comprising:
forming an antireflective layer between the cap layer and the photoresist layer.

48. The method of claim 46 further comprising:
patterning the photoresist layer to form at least one opening.

49. The method of claim 48 further comprising:
patterning the cap to form at least one opening continuous with the opening of the photoresist layer.

50. The method of claim 49 further comprising:
patterning the amorphous carbon layer to form at least one opening continuous with the opening of the cap layer.

51. A method comprising:
forming a plurality of doped regions in a substrate of a memory device;
forming a plurality of gate structures over the substrate;
forming a glass layer over the gate structures;
forming a barrier layer between the gate structures and the glass layer for preventing cross-diffusion between the gate structures and the glass layer;
forming a plurality of contacts, each of the contacts being located between two gate structures and contacting one of the doped regions;
forming an amorphous carbon layer over the substrate, wherein the amorphous carbon layer is transparent in visible light range; and
forming a cap layer over the amorphous carbon layer, wherein the cap layer includes non-oxide materials.

52. The method of claim 51, wherein one of the gate structures and a pair of doped regions of the plurality of doped regions are parts of a transistor.

53. The method of claim 52, wherein a first doped region of the pair of doped regions is a part of a capacitor plate.

54. The method of claim 53, wherein a second doped region of the pair of doped regions is coupled to a bit line of the memory device via one of the contacts.

55. The method of claim 51 further comprising:
forming a photoresist layer formed directly over the cap layer.

56. The method of claim 55 further comprising:
patterning the photoresist layer to form at least one opening.

57. The method of claim 56 further comprising:
patterning the cap layer to form at least one opening continuous with the opening of the photoresist layer.

58. The method of claim 57 further comprising:
patterning the amorphous carbon layer to form at least one opening continuous with the opening of the cap layer.

* * * * *

UNITED STATES PATENT AND TRADEMARK OFFICE
CERTIFICATE OF CORRECTION

PATENT NO. : 7,341,957 B2  Page 1 of 1
APPLICATION NO. : 11/215671
DATED : March 11, 2008
INVENTOR(S) : Sandhu et al.

It is certified that error appears in the above-identified patent and that said Letters Patent is hereby corrected as shown below:

Title page, Item (54), in column 1, line 2, after "INCLUDING" insert -- AN --.

Title page, Item (56), under "Other Publications", in column 2, line 2, delete "of" and insert -- for --, therefor.

In column 2, line 2, after "INCLUDING" insert -- AN --.

Signed and Sealed this

Seventeenth Day of June, 2008

JON W. DUDAS
*Director of the United States Patent and Trademark Office*